US008560913B2

(12) United States Patent
Kelly et al.

(10) Patent No.: US 8,560,913 B2
(45) Date of Patent: Oct. 15, 2013

(54) DATA EMBEDDING SYSTEM

(75) Inventors: Peter Kelly, Cambridge (GB); Michael Raymond Reynolds, Cambridge (GB); Christopher John Joseph Sutton, Cambridge (GB)

(73) Assignee: Intrasonics S.A.R.L., Luxembourg (LU)

( * ) Notice: Subject to any disclaimer, the term of this patent is extended or adjusted under 35 U.S.C. 154(b) by 123 days.

(21) Appl. No.: 13/232,190

(22) Filed: Sep. 14, 2011

(65) Prior Publication Data

US 2012/0004920 A1 Jan. 5, 2012

Related U.S. Application Data

(62) Division of application No. 12/994,716, filed as application No. PCT/GB2009/001354 on May 29, 2009.

(30) Foreign Application Priority Data

May 29, 2008 (WO) ................ PCT/GB2008/001820
Jul. 31, 2008 (GB) .................................. 0814041.0
Nov. 28, 2008 (GB) .................................. 0821841.4

(51) Int. Cl.
*H03M 13/00* (2006.01)

(52) U.S. Cl.
USPC ........................................................ 714/752

(58) Field of Classification Search
USPC ........... 714/751–752, 784; 713/176; 380/255; 704/500
See application file for complete search history.

(56) References Cited

U.S. PATENT DOCUMENTS

| | | | |
|---|---|---|---|
| 657,379 | A | 9/1900 | Bakken |
| 2,660,662 | A | 11/1953 | Scherbatskoy |
| 3,651,471 | A | 3/1972 | Haselwood et al. |
| 3,732,536 | A | 5/1973 | Larka et al. |
| 3,742,463 | A | 6/1973 | Haselwood et al. |
| 3,845,391 | A | 10/1974 | Crosby |
| 4,025,851 | A | 5/1977 | Haselwood et al. |
| 4,237,449 | A | 12/1980 | Zibell |
| 4,425,642 | A | 1/1984 | Moses et al. |
| 4,514,725 | A | 4/1985 | Bristley |
| 4,642,685 | A | 2/1987 | Roberts et al. |
| 4,718,106 | A | 1/1988 | Weinblatt |

(Continued)

FOREIGN PATENT DOCUMENTS

| | | |
|---|---|---|
| CA | 2 073 387 | 1/1993 |
| CA | 2 129 925 | 2/1996 |

(Continued)

OTHER PUBLICATIONS

Office Action dated Oct. 12, 2011, U.S. Appl. No. 10/500,016.

(Continued)

*Primary Examiner* — Shelly A Chase
(74) *Attorney, Agent, or Firm* — Alston & Bird LLP

(57) ABSTRACT

A data hiding system is described for hiding data within an audio signal. The system can be used for watermarking, data communications, audience surveying etc. The system hides data in an audio signal by adding artificial echoes whose polarity varies with the data to be hidden. In one embodiment, each data value is represented by a positive and a negative echo having different delays. A receiver can then remove the effects of natural echoes and/or periodicities in the audio signal by differencing measurements obtained at the different delays.

28 Claims, 10 Drawing Sheets

(56) References Cited

U.S. PATENT DOCUMENTS

| | | | | |
|---|---|---|---|---|
| 4,750,034 | A | 6/1988 | Lem | |
| 4,807,031 | A | 2/1989 | Broughton et al. | |
| 4,840,602 | A | 6/1989 | Rose | |
| 4,846,693 | A | 7/1989 | Baer | |
| 4,923,428 | A | 5/1990 | Curran | |
| 4,945,412 | A | 7/1990 | Kramer | |
| 5,085,610 | A | 2/1992 | Engel et al. | |
| 5,090,936 | A | 2/1992 | Satoh et al. | |
| 5,108,341 | A | 4/1992 | DeSmet | |
| 5,113,437 | A | 5/1992 | Best et al. | |
| 5,136,613 | A | 8/1992 | Dumestre, III | |
| 5,191,615 | A | 3/1993 | Aldava et al. | |
| 5,301,167 | A | 4/1994 | Proakis et al. | |
| 5,305,348 | A | 4/1994 | Izumi | |
| 5,314,336 | A | 5/1994 | Diamond et al. | |
| 5,319,735 | A | 6/1994 | Preuss et al. | |
| 5,353,352 | A | 10/1994 | Dent et al. | |
| 5,412,620 | A | 5/1995 | Cafarella et al. | |
| 5,436,941 | A | 7/1995 | Dixon et al. | |
| 5,442,343 | A | 8/1995 | Cato et al. | |
| 5,446,756 | A | 8/1995 | Mallinckrodt | |
| 5,450,490 | A | 9/1995 | Jensen et al. | |
| 5,461,371 | A | 10/1995 | Matsumoto et al. | |
| 5,475,798 | A | 12/1995 | Handlos | |
| 5,479,442 | A | 12/1995 | Yamamoto | |
| 5,493,281 | A | 2/1996 | Owens | |
| 5,499,265 | A | 3/1996 | Dixon et al. | |
| 5,519,779 | A | 5/1996 | Proctor et al. | |
| 5,539,705 | A | 7/1996 | Akerman et al. | |
| 5,555,258 | A | 9/1996 | Snelling et al. | |
| 5,574,773 | A | 11/1996 | Grob et al. | |
| 5,579,124 | A | 11/1996 | Aijala et al. | |
| 5,604,767 | A | 2/1997 | Dixon et al. | |
| 5,648,789 | A | 7/1997 | Beadles et al. | |
| 5,657,379 | A | 8/1997 | Honda et al. | |
| 5,663,766 | A | 9/1997 | Sizer, II | |
| 5,687,191 | A | 11/1997 | Lee et al. | |
| 5,713,337 | A | 2/1998 | Scheffel | |
| 5,719,937 | A | 2/1998 | Warren et al. | |
| 5,734,639 | A | 3/1998 | Bustamante et al. | |
| 5,752,880 | A | 5/1998 | Gabai et al. | |
| 5,774,452 | A | 6/1998 | Wolosewicz | |
| 5,822,360 | A | 10/1998 | Lee et al. | |
| 5,828,325 | A | 10/1998 | Wolosewicz et al. | |
| 5,848,155 | A | 12/1998 | Cox | |
| 5,893,067 | A | 4/1999 | Bender et al. | |
| 5,918,223 | A | 6/1999 | Blum et al. | |
| 5,930,369 | A | 7/1999 | Cox et al. | |
| 5,937,000 | A | 8/1999 | Lee et al. | |
| 5,940,135 | A | 8/1999 | Petrovic et al. | |
| 5,945,932 | A | 8/1999 | Smith et al. | |
| 5,960,398 | A | 9/1999 | Fuchigami et al. | |
| 5,963,909 | A | 10/1999 | Warren et al. | |
| 5,978,413 | A | 11/1999 | Bender | |
| 5,999,899 | A | 12/1999 | Robinson | |
| 6,021,432 | A | 2/2000 | Sizer, II et al. | |
| 6,022,273 | A | 2/2000 | Gabai et al. | |
| 6,035,177 | A | 3/2000 | Moses et al. | |
| 6,061,793 | A | 5/2000 | Tewfik et al. | |
| 6,125,172 | A | 9/2000 | August et al. | |
| 6,263,505 | B1 | 7/2001 | Walker et al. | |
| 6,290,566 | B1 | 9/2001 | Gabai et al. | |
| 6,298,322 | B1 | 10/2001 | Lindemann | |
| 6,309,275 | B1 | 10/2001 | Fong et al. | |
| 6,370,666 | B1 | 4/2002 | Lou et al. | |
| 6,389,055 | B1 | 5/2002 | August et al. | |
| 6,434,253 | B1 | 8/2002 | Hayashi et al. | |
| 6,438,117 | B1 | 8/2002 | Grilli et al. | |
| 6,442,283 | B1 | 8/2002 | Tewfik et al. | |
| 6,442,518 | B1 | 8/2002 | Van Thong et al. | |
| 6,463,413 | B1 | 10/2002 | Applebaum et al. | |
| 6,512,919 | B2 | 1/2003 | Ogasawara | |
| 6,584,138 | B1 | 6/2003 | Neubauer et al. | |
| 6,636,551 | B1 | 10/2003 | Ikeda et al. | |
| 6,650,877 | B1 | 11/2003 | Tarbouriech et al. | |
| 6,674,861 | B1 | 1/2004 | Xu et al. | |
| 6,708,214 | B1 | 3/2004 | La Fleur | |
| 6,737,957 | B1 | 5/2004 | Petrovic et al. | |
| 6,765,950 | B1 | 7/2004 | Nuytkens et al. | |
| 6,773,344 | B1 | 8/2004 | Gabai et al. | |
| 6,782,253 | B1 | 8/2004 | Shteyn et al. | |
| 6,785,539 | B2 | 8/2004 | Hale et al. | |
| 6,832,093 | B1 | 12/2004 | Ranta | |
| 6,850,555 | B1 | 2/2005 | Barclay | |
| 6,876,623 | B1 | 4/2005 | Lou et al. | |
| 6,892,175 | B1 | 5/2005 | Cheng et al. | |
| 7,013,301 | B2 | 3/2006 | Holm et al. | |
| 7,031,271 | B1 | 4/2006 | LaRosa et al. | |
| 7,158,676 | B1 | 1/2007 | Rainsford | |
| 7,308,486 | B2 | 12/2007 | Althin et al. | |
| 2001/0025241 | A1 | 9/2001 | Lange et al. | |
| 2001/0030710 | A1 | 10/2001 | Werner | |
| 2002/0069263 | A1 | 6/2002 | Sears et al. | |
| 2002/0078359 | A1 | 6/2002 | Seok et al. | |
| 2003/0051252 | A1 | 3/2003 | Miyaoku et al. | |
| 2003/0153355 | A1 | 8/2003 | Warren | |
| 2004/0137929 | A1 | 7/2004 | Jones et al. | |
| 2004/0169581 | A1 | 9/2004 | Petrovic et al. | |
| 2005/0240768 | A1 * | 10/2005 | Lemma et al. | 713/176 |
| 2006/0239502 | A1 | 10/2006 | Petrovic et al. | |
| 2007/0036357 | A1 * | 2/2007 | Van der Veen et al. | 380/246 |
| 2008/0027734 | A1 | 1/2008 | Zhao et al. | |
| 2008/0049971 | A1 | 2/2008 | Ramos et al. | |
| 2009/0235079 | A1 * | 9/2009 | Baum et al. | 713/176 |

FOREIGN PATENT DOCUMENTS

| | | | |
|---|---|---|---|
| CA | 2 162 614 | | 5/1996 |
| CA | 2 230 071 | | 12/1997 |
| CA | 2 457 089 | | 2/2003 |
| CN | 101014953 | A | 8/2007 |
| DE | 32 29 405 | | 2/1984 |
| EP | 0 135 192 | | 3/1985 |
| EP | 0 172 095 | | 2/1986 |
| EP | 0 347 401 | | 12/1989 |
| EP | 0 688 487 | | 5/1994 |
| EP | 0 606 703 | | 7/1994 |
| EP | 0 631 226 | | 12/1994 |
| EP | 0 669 070 | | 5/1995 |
| EP | 0 674 405 | B1 | 9/1995 |
| EP | 0713335 | A2 | 5/1996 |
| EP | 0 766 468 | A2 | 4/1997 |
| EP | 0779759 | A2 | 6/1997 |
| EP | 0 883 939 | | 8/1997 |
| EP | 0 822 550 | A1 | 2/1998 |
| EP | 0 828 372 | A2 | 3/1998 |
| EP | 0 863 631 | A2 | 9/1998 |
| EP | 0 872 995 | A2 | 10/1998 |
| EP | 1 064 742 | | 7/1999 |
| EP | 1 158 800 | A1 | 11/2001 |
| EP | 1 423 936 | | 3/2003 |
| EP | 1 576 582 | | 6/2004 |
| EP | 1542227 | A1 | 6/2005 |
| EP | 2325839 | A1 | 5/2011 |
| FR | 2 626 731 | | 8/1989 |
| GB | 2 135 536 | A | 8/1984 |
| GB | 2 192 743 | A | 1/1988 |
| GB | 2 196 167 | A | 4/1988 |
| GB | 2 256 113 | A | 11/1992 |
| GB | 2301989 | A | 12/1996 |
| GB | 2 334 133 | A | 8/1999 |
| GB | 2 343 774 | A | 5/2000 |
| GB | 2 345 779 | A | 7/2000 |
| GB | 2386526 | A | 9/2003 |
| JP | 58-69536 | | 4/1983 |
| JP | 59-166545 | | 11/1984 |
| JP | 63-088673 | | 4/1988 |
| JP | 63-147738 | | 9/1988 |
| JP | 63-272134 | | 11/1988 |
| JP | 04-092518 | | 3/1992 |
| JP | 5-252578 | | 9/1993 |
| JP | 05-316598 | | 11/1993 |
| JP | 06-311079 | | 11/1994 |
| JP | 07-245782 | | 9/1995 |

(56) References Cited

FOREIGN PATENT DOCUMENTS

| | | | |
|---|---|---|---|
| JP | 10-021259 | | 1/1998 |
| JP | 2000-152217 | | 5/2000 |
| JP | 2000-207170 | | 7/2000 |
| JP | 2000-236576 | | 8/2000 |
| JP | 2000-267952 | | 9/2000 |
| JP | 2000-308130 | | 11/2000 |
| KR | 2003-0037174 | | 11/2001 |
| WO | WO 91/10490 | | 7/1991 |
| WO | WO 91/10491 | | 7/1991 |
| WO | WO 93/07689 | | 4/1993 |
| WO | WO 94/08677 | | 4/1994 |
| WO | WO 96/19274 | | 6/1996 |
| WO | WO 97/21279 | | 6/1997 |
| WO | WO 97/31440 | | 8/1997 |
| WO | WO 97/33391 | | 9/1997 |
| WO | WO 97/41936 | | 11/1997 |
| WO | WO 98/06195 | | 2/1998 |
| WO | WO 98/26529 | A2 | 6/1998 |
| WO | WO 98/32248 | | 7/1998 |
| WO | WO 99/00979 | | 1/1999 |
| WO | WO 99/59258 | A1 | 11/1999 |
| WO | WO 00/15316 | | 3/2000 |
| WO | WO 00/21203 | A1 | 4/2000 |
| WO | WO 00/39955 | | 7/2000 |
| WO | WO 00/44168 | | 7/2000 |
| WO | WO 00/57586 | | 9/2000 |
| WO | WO 01/10065 | A1 | 2/2001 |
| WO | WO 01/31816 | A1 | 5/2001 |
| WO | WO 01/57619 | A2 | 8/2001 |
| WO | WO 01/61987 | A2 | 8/2001 |
| WO | WO 02/11123 | A2 | 2/2002 |
| WO | WO 02/45273 | A2 | 6/2002 |
| WO | WO 02/45286 | A2 | 6/2002 |
| WO | WO 03/102947 | A1 | 12/2003 |
| WO | WO 2004/036352 | A2 | 4/2004 |
| WO | WO 2005/122640 | A1 | 12/2005 |

OTHER PUBLICATIONS

International Search Report for International Application No. PCT/GB2009/001354 completed Aug. 11, 2009; 3 pages.

International Search Report for International Application No. PCT/GB2002/005908 completed Jan. 15, 2004; 3 pages.

BBC Research Department; *Simultaneous Subliminal Signalling in Conventional Sound Circuits: A Feasability Study*, Research Department Report No. 1971/1, Jan. 1971, pp. 1-12.

Bender, W. et al., "Techniques for Data Hiding", Society of Photographic Instrutmentation Engineers; Proceedings vol. 2420, 1995; pp. 164-173.

Chen, T.C., et al.; "Highly Robust, Secure and Perceptual-Quality Echo Hiding Scheme"; IEEE Transaction on Audio, Speech, and Language Processing; IEEE Service Center, New York, NY; US; vol. 16; No. 3; Mar. 2008; pp. 629-638.

Chung, Tae-Yun, et al; "Digital Watermarking for Copyright Protection of MPEG2 Compressed Video", IEEE Transactions on Consumer Electronics; vol. 44; No. 3; Aug. 1998; pp. 895-901.

Cox, Ingemar J., et al.; "A Secure, Imperceptible yet Perceptually Salient, Spread Spectrum Watermark for Multimedia"; SouthCon 96 Conference Record; 1996; Published in: Orlando, FL; pp. 192-197.

Cox, Ingemar J., et al.; "A Secure, Robust Watermark for Multimedia", "Proceedings of the First International Workshop on Information Hiding"; Published in: Cambridge, UK; 1996; pp. 185-206.

Cox, Cox, Ingemar J., et al.; "Secure Spread Spectrum Watermarking for Images, Audio and Video"; International Conference on Image Processing; vol. 3 of 3, Published in: Lausanne, Switzerland; 1996; pp. 243-246.

Cox, Cox, Ingemar J., et al.; "Secure Spread Spectrum Watermarking for Multimedia"; IEEE Transactions on Image Processing; vol. 6; No. 12; 1997, pp. 1673-1687.

Dymanski, P.; "Watermarking of Audio Signals Using Adaptive Subband Filtering and Manchester Signaling"; 14th International Workshop on Systems, Signals and Image Processing and Eurasip Conference Focused on Speech and Image Processing, Multimedia Communications and Services; IEEE; 2007; pp. 221-224.

Gerasimov, V., et al.; "Things that talk: Using sound for device-to-device and device-to-human communication"; IBM Systems Journal; vol. 39; Nos. 3 & 4; 2000; pp. 530-546.

Gruhl, Daniel., et al.; "Echo Hiding"; Proceedings of the First International Workshop on Information Hiding ; vol. 295; 1996; pp. 295-315, XP002040126.

Huang, Dong-Yan, et al.; "Robust and Inaudible Multi-echo Audio Watermarking"; PCM '02 Proceedings of the Third IEEE Pacific Rim Conference on Multimedia: Advances in Multimedia Information Processing; 2002; pp. 615-622.

Iwakiri, Munetoshi, et al.; "Digital Watermark Scheme for High Quality Audio Data by Spectrum Spreading and Modified Discrete Cosine Transform"; Information Processing Society of Japan; vol. 39; No. 9; Published in Japan; 1998; pp. 2631-2637.

Neubauer, Chr., et al; "Continuous Steganographic Data Transmission Using Uncompressed Audio"; Information Hiding, Second International Workshop; Published in: Portland, Oregon; 1998; pp. 208-217.

Petrovic, R., et al.; "Data Hiding within Audio Signals"; 4th International Conference on Telecommunications in Modern Satellite, Cable and Broadcasting Services; 1999; pp. 88-95; XP010359110.

Pohlmann, Ken C.; "Fundamentals of Digital Audio; Digital Audio Tape (DAT); The Compact Disc", "Principles of Digital Audio, Second Edition"; pp. 47-48; 255-256; 323.

Seok, Jong-Won, et al.; "Prediction-Based Audio Watermark Detection Algorithm"; Presented at the $109^{th}$ Audio Engineering Society Convention; 2000; Publisher: Audio Engineering Society , Published in: Los Angeles, CA; pp. 1-11.

Sundaram, Ganapathy S., et al.; "An Embedded Cryptosystem for Digital Broadcasting"; IEEE 6th International Conference on Universal Personal Communications Record; vol. 2; Published in: San Diego, CA; 1997; pp. 401-405.

Swanson, Mitchell D., et al.; "Robust audio watermarking using perceptual masking", Journal of Signal Processing Systems; vol. 66; Publisher: Elsevier Science; 1998; pp. 337-355.

Wu, Wen-Chih, et al.; "An Analysis-by-Synthesis Echo Watermarking Method"; 2004 IEEE International Conference on Multimedia and Expo (ICME); 2004; pp. 1935-1938.

European Search Report for Application No. EP 13 16 8796 dated Jul. 15, 2013.

United States Patent and Trademark Office, Office Action for U.S. Appl. No. 12/994,716, Jul. 15, 2013, 36 pages, USA.

* cited by examiner

MESSAGE DATA ='1'

MESSAGE DATA ='0'

DATA EMBEDDING SYSTEM

CROSS REFERENCE TO RELATED APPLICATIONS

This application is divisional of U.S. application Ser. No. 12/994,716, filed Feb. 9, 2011, which is a national stage application, filed under 35 U.S.C. §371, of International Application No. PCT/GB09/01354, filed May 29, 2009, which claims priority to International Application No. PCT/GB08/01820, filed Jul. 31, 2008; Great Britain Application No. 0814041.0, filed Jul. 31, 2008; and Great Britain Application No. 0821841.4, filed Nov. 28, 2008, all of which are hereby incorporated by reference in their entirety.

FIELD AND BACKGROUND OF THE INVENTION

The present invention relates to a system for embedding data in an audio signal and to its subsequent recovery, which can be used for watermarking, data communications, audience surveying etc. The invention has particular relevance, to a system for hiding data in an audio signal by adding echoes to the audio signal and to a system for recovering the hidden data by detecting the added echoes.

U.S. Pat. No. 5,893,067 discloses a technique for hiding data within an audio signal for transmission to a remote receiver. The data is hidden in the audio signal by adding an artificial echo to the audio signal and varying the amplitude and/or delay of the echo in accordance with the data to be hidden.

A problem with the data hiding technique described in U.S. Pat. No. 5,893,067 is that in most situations, natural echoes can mask the artificial echoes making it difficult for the receiver to be able to identify the artificial echoes and hence recover the hidden data.

SUMMARY OF THE INVENTION

The present invention aims to provide an alternative data hiding technique. One embodiment of the invention at least alleviates the above problem by applying echoes of opposite polarity to represent each data value.

According to one aspect, the present invention provides a method of embedding a data value in an audio signal, the method comprising: generating an echo of at least a portion of the received audio signal; and embedding the data value in the audio signal by combining the received audio signal with the generated echo; wherein the data value is embedded in the audio by varying the polarity of the echo that is combined with the audio signal in dependence upon the data value. The inventors have found that using polarity modulation to embed the data in the audio signal can make the recovery of the embedded data easier in the receiver, especially in the presence of natural echoes caused, by for example the acoustics of the room. The polarity modulation can be achieved by varying the echo that is generated and/or by varying the way in which the echo is combined with the audio signal.

In one embodiment, the generating step generates a first echo of at least a portion of the received audio signal and a second echo of at least a portion of the received audio signal, the first and second echoes having first and second polarities respectively, which polarities vary in dependence upon the data value; and wherein the embedding step embeds the data value in the audio signal by combining the received audio signal with the generated first and second echoes.

Each of the echoes may be generated by repeating at least a part of said audio signal. The first echo may be generated by repeating a first portion of the audio signal and the second echo may be generated by repeating a second portion of said audio signal. Alternatively, the first and second echoes may be generated by repeating substantially the same first portion of the audio signal. Where the audio signal is received as a stream of samples, the or each echo may be generated by passing the stream of audio samples through a delay line.

In one embodiment, third and fourth echoes may be generated, the third echo having the same polarity as said second echo and the fourth echo having the same polarity as said first echo. In this case, the third and fourth echoes may be generated by repeating substantially the same second portion of the audio signal which is different to the first portion repeated by the first and second echoes. The second portion of the audio signal may be adjacent to the first portion. The generating step may generate the third and fourth echoes by inverting the polarity of a gain factor applied to the echoes before being combined with the audio signal.

The first echo may be combined with the audio signal at a first delay relative to the first portion of the audio signal; the second echo may be combined with the audio signal at a second delay relative to said first echo; the third echo may be combined with said audio signal at a third delay relative to said second portion of the audio signal; and the fourth echo may be combined with the audio signal at a fourth delay relative to the third echo. The first delay may be equal to said third delay and/or the second delay may be equal to said fourth delay. In one embodiment, the delays and the amplitudes of the echoes are independent of the data value.

Preferably the first and third delays are between 0.5 ms and 100 ms and more preferably between 5 ms and 40 ms; and the second and fourth delays delayed (relative to the first and third echoes respectively) by between 0.125 ms and 3 ms and more preferably between 0.25 ms and 1 ms, as these delays are similar to those of natural echoes and so are less noticeable to users. In one embodiment, the or each echo has an amplitude that is less than the amplitude of said audio signal. Preferably the or each echo is faded in and out to reduce obtrusiveness of the echoes to a listener.

The first and second portions of the audio signal should be long enough for the receiver to be able to detect the presence of the echoes but not too long as to overly reduce the data rate that can be communicated. The inventors have found that echoes having durations of between 20 ms and 500 ms provides a reasonable data rate whilst keeping to a minimum data transmission errors when transmission occurs over an acoustic link. If transmission is over an electrical link, then shorter echoes may be used.

The echoes may be combined with the audio signal by adding and/or subtracting the echoes to/from the audio signal. The polarity of each echo can therefore be controlled by controlling the way in which each echo is combined with the audio signal.

This aspect of the invention also provides a computer implementable instructions product comprising computer implementable instructions for causing a programmable computer device to carry out the method described above.

This aspect also provides an apparatus for embedding a data value in an audio signal, the apparatus comprising: an echo generator operable to generate an echo of at least a portion of the received audio signal; and a combiner operable to combine the received audio signal with the generated first and second echoes to embed the data value in the audio signal; wherein the echo generator and/or the combiner are arranged so that the data value is embedded in the audio by varying the polarity of the echo that is combined with the audio signal in dependence upon the data value.

According to another aspect, the present invention provides a method of recovering a data value embedded in an audio signal, the method comprising: receiving an input signal having the audio signal and an echo of at least part of the audio signal whose polarity depends upon said data value; processing the received input signal to determine the polarity of the echo; and recovering the data value from the determined polarity.

The input signal may comprise a first echo of at least a portion of the audio signal and a second echo of at least a portion of the audio signal, the first and second echoes having first and second polarities respectively, which polarities vary in dependence upon the data value; and wherein the processing step processes the input signal to combine the first and second echoes and to determine the polarity of the combined echoes and wherein the recovering step recovers the data value from the determined polarity of the combined echoes.

In one embodiment the processing step processes the input signal to determine a first autocorrelation measure that depends upon the first echo and a second autocorrelation measure that depends upon the second echo and combines the echoes by differencing the first and second autocorrelation measures and determines the polarity of the combined echoes by determining the polarity of the result of the differencing step.

The first echo may be of a first portion of the audio signal and the second echo may be of a second portion of the audio signal. Alternatively the first and second echoes may be repeats of substantially the same portion of the audio signal.

In one embodiment, the input signal comprises first, second, third and fourth echoes, the first and fourth echoes having the same polarity and the second and third echoes having the same polarity which is opposite to the polarity of the first and fourth echoes, wherein the processing step processes the input signal to combine the first to fourth echoes and to determine the polarity of the combined echoes and wherein the recovering step recovers the data value from the determined polarity of the combined echoes.

In this embodiment, the processing step may process the input signal to determine a first autocorrelation measure that depends upon the first echo, a second autocorrelation measure that depends upon the second echo, a third autocorrelation measure that depends upon the third echo and a fourth autocorrelation measure that depends upon the fourth echo and combines the echoes by differencing the autocorrelation measures and determines the polarity of the combined echoes by determining the polarity of a result of the differencing step.

The differencing step may perform a first difference of the first and third autocorrelation measures, a second difference of the second and fourth autocorrelation measures, a third difference of the result of said first difference and the result of the second difference and wherein the polarity of the combined echoes may be determined from the polarity of a result of the third difference.

The first and second echoes may be repeats of substantially the same first portion of the audio signal and the third and fourth echoes may be repeats of substantially the same second portion of the audio signal. Alternatively, the first and third echoes may be repeats of substantially the same first portion of the audio signal and the second and fourth echoes may be repeats of substantially the same second portion of the audio signal. In one embodiment, the or each echo is faded in and out to reduce obtrusiveness of the echoes to a listener. In this case, the polarity of the echo may be determined when the amplitude of the echo is at or near a maximum.

The first echo may be delayed relative to said first portion of the audio signal by a first delay; the second echo may be delayed relative to the first echo by a second delay; the third echo may be delayed relative to the second portion of the audio signal by a third delay; and the fourth echo may be delayed relative to the third echo by a fourth delay. The first delay may be equal to the third delay and/or the second delay may be equal to said fourth delay.

According to this aspect, a computer implementable instructions product is also provided comprising computer implementable instructions for causing a programmable computer device to carry out the above method.

This aspect also provides an apparatus for recovering a data value embedded in an audio signal, the apparatus comprising: an input for receiving an input signal having the audio signal and an echo of at least part of the audio signal whose polarity depends upon said data value; a processor operable to process the input signal to determine the polarity of the echo; and a data regenerator operable to recover the data value from the determined polarity.

These and other aspects of the invention will become apparent to those skilled in the art from the following detailed description of exemplary embodiments, which are described with reference to the following drawings in which:

FIG. 1 is a block diagram illustrating the main components of a transmitter and receiver used in an exemplary embodiment;

FIG. 2*a* is an impulse plot illustrating the echoes that are added to an audio signal to encode a binary "one";

FIG. 2*b* is an impulse plot illustrating the echoes that are added to an audio signal to encode a binary "zero";

FIG. 3*a* is an impulse plot illustrating the presence of artificial echoes for a binary "one" after Manchester encoding and illustrating natural echoes;

FIG. 3*b* is an impulse plot illustrating the presence of artificial echoes for a binary "zero" after Manchester encoding and illustrating natural echoes;

Figure 1:
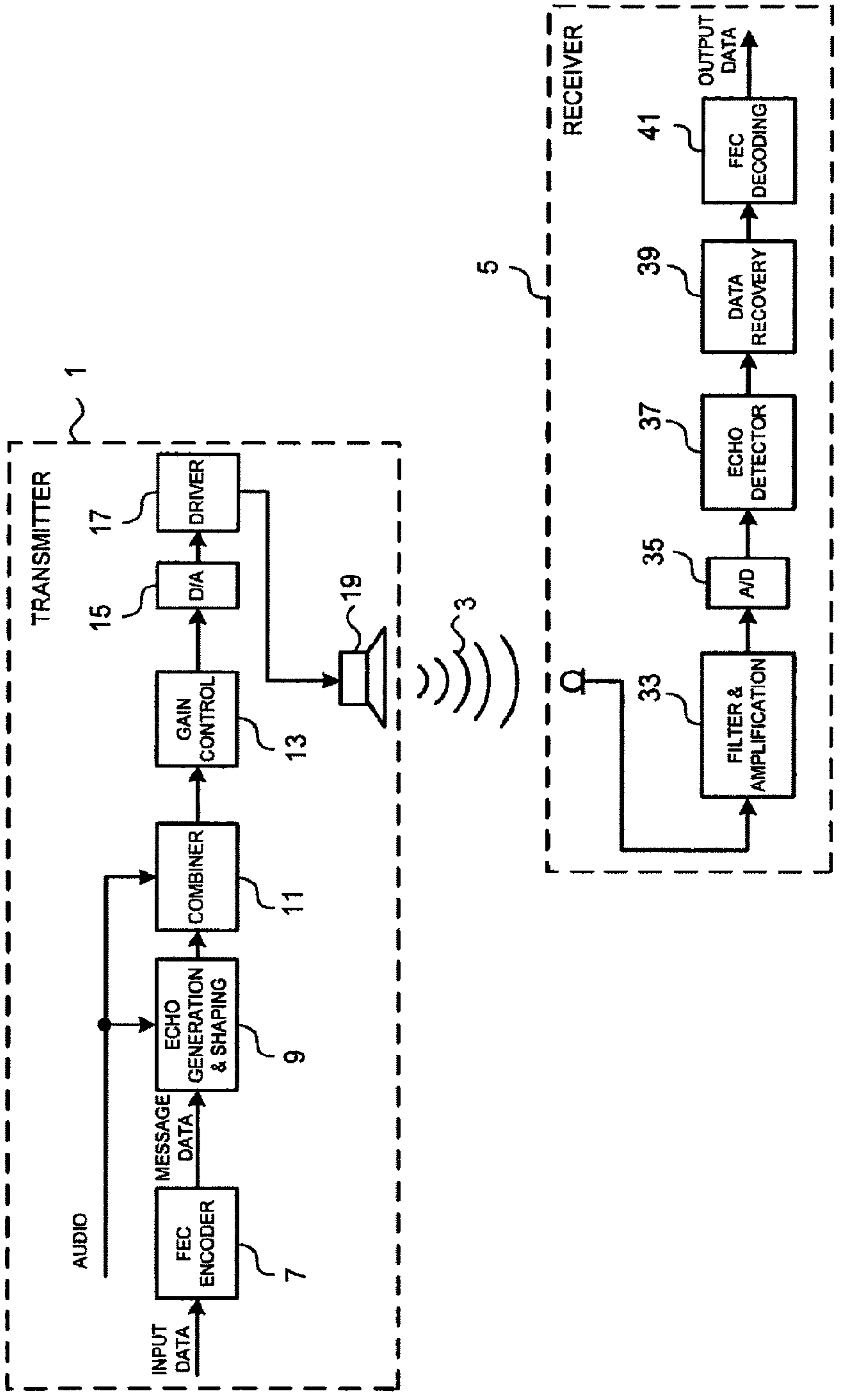
Figure 6B:
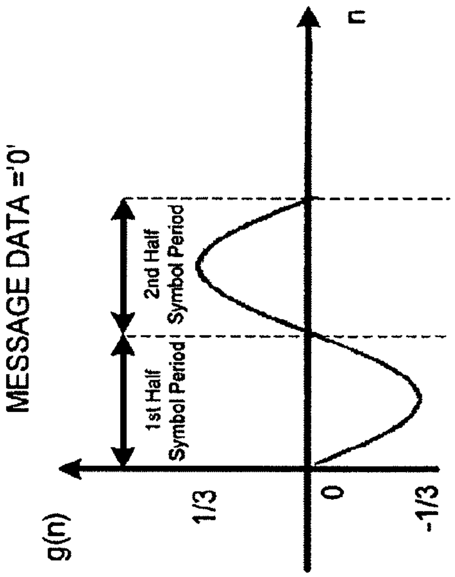
Figure 6A:
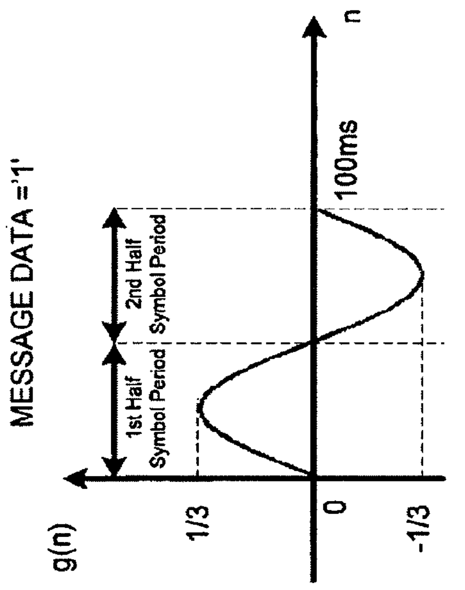
Figure 6D:
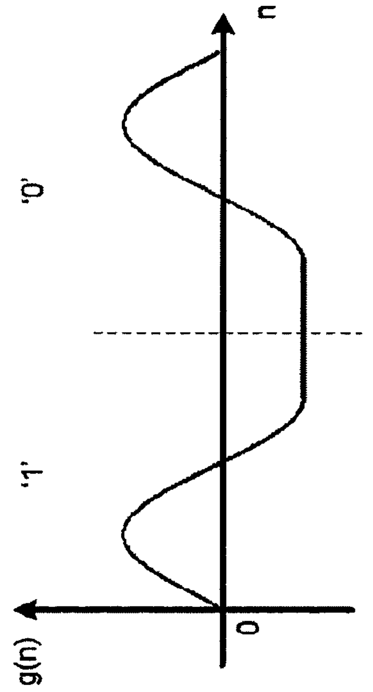
Figure 6C:
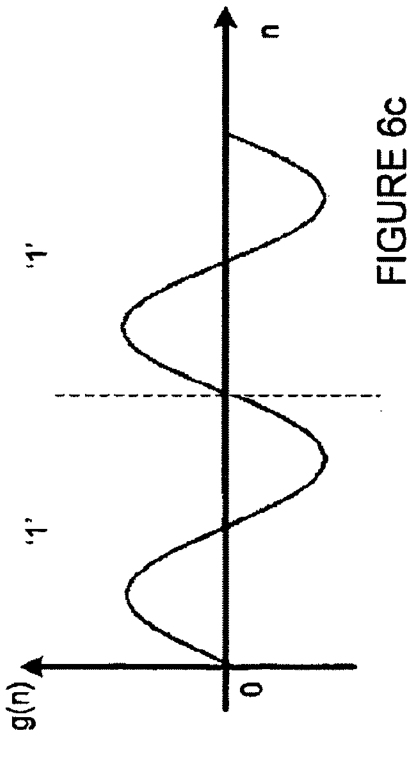
Figure 7:
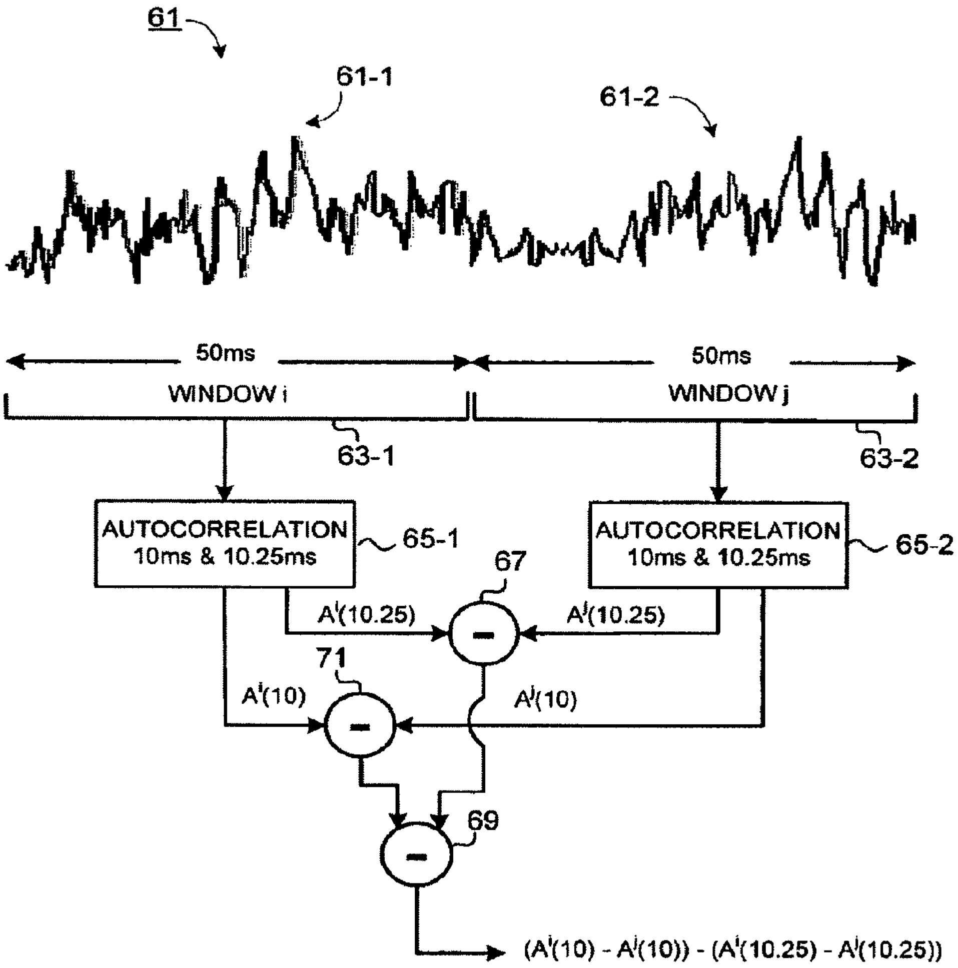
Figure 8A:
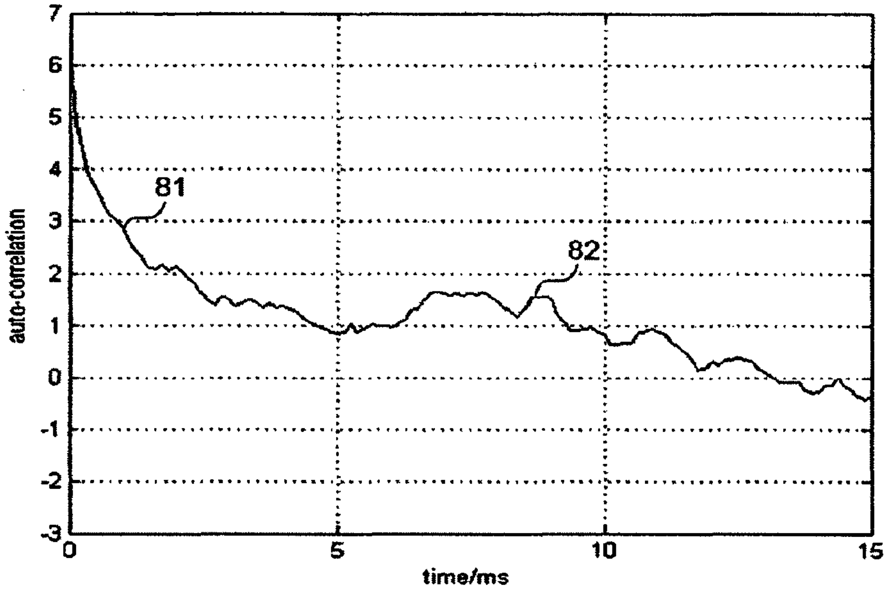
Figure 8B:
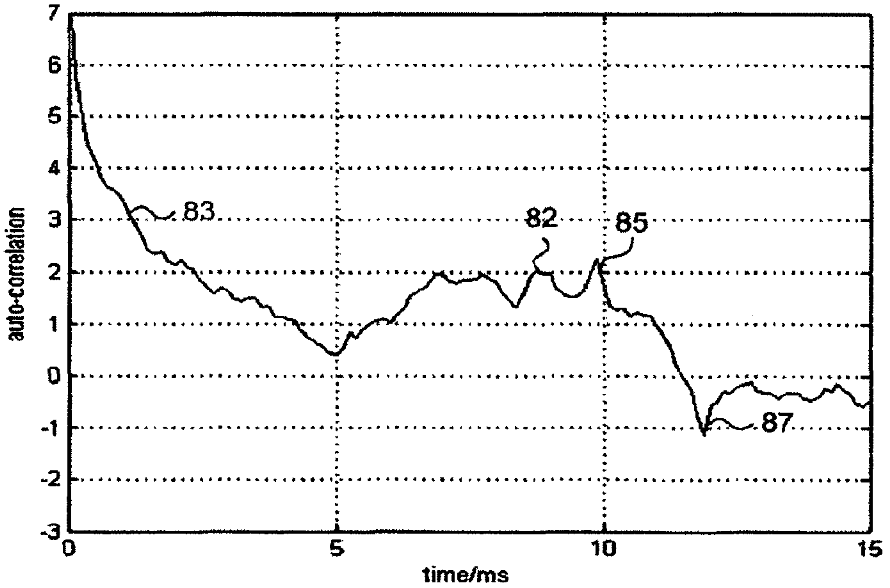
Figure 8C:
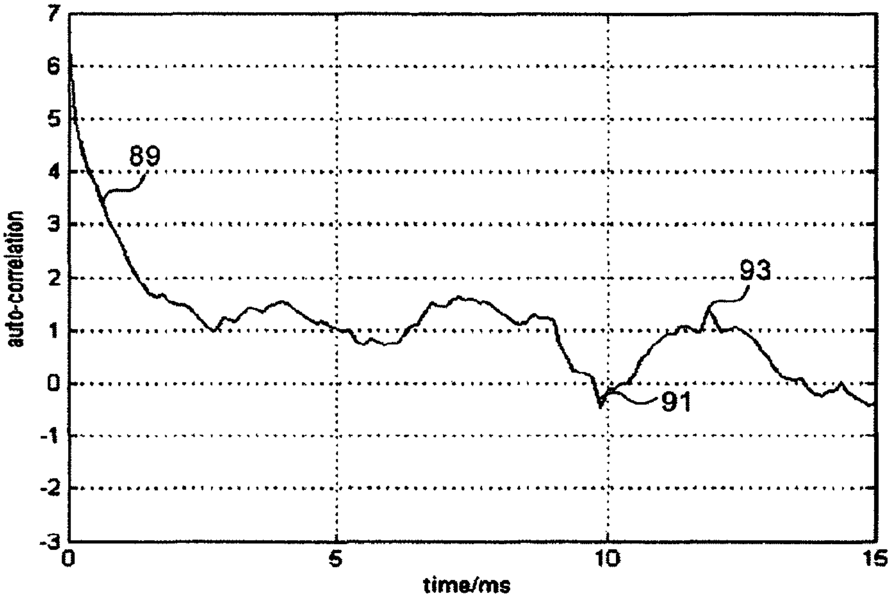
Figure 8D:
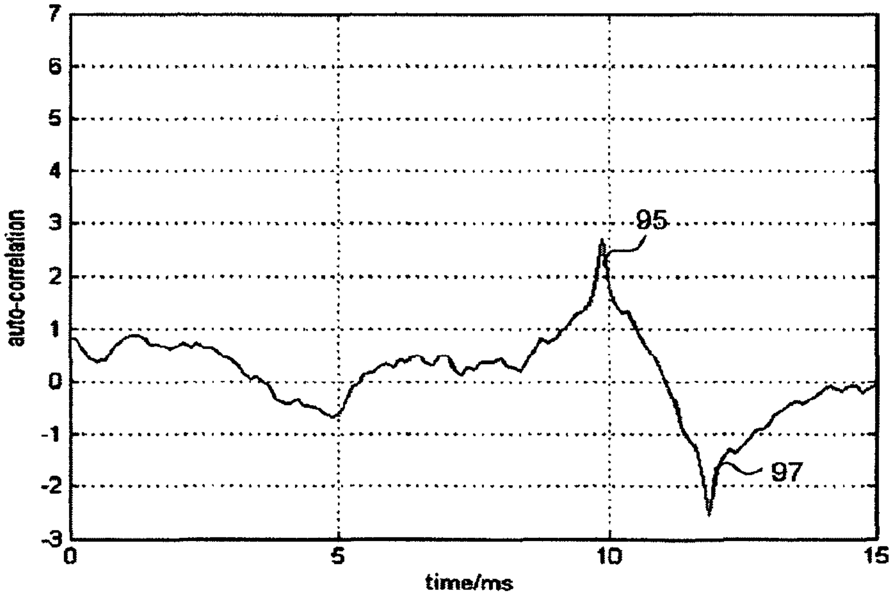
Figure 9:
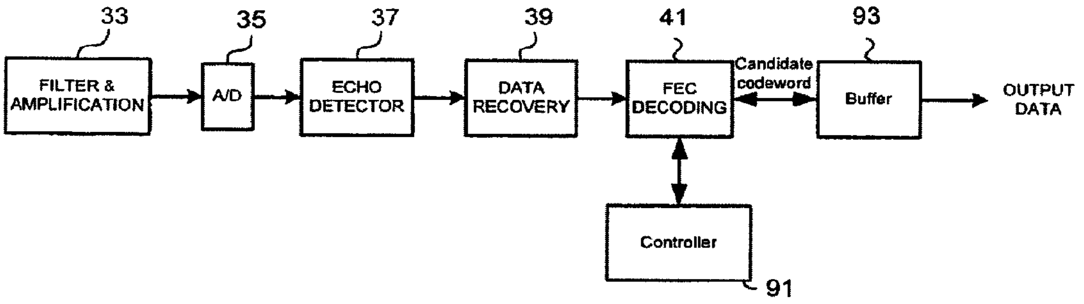
Figure 10:
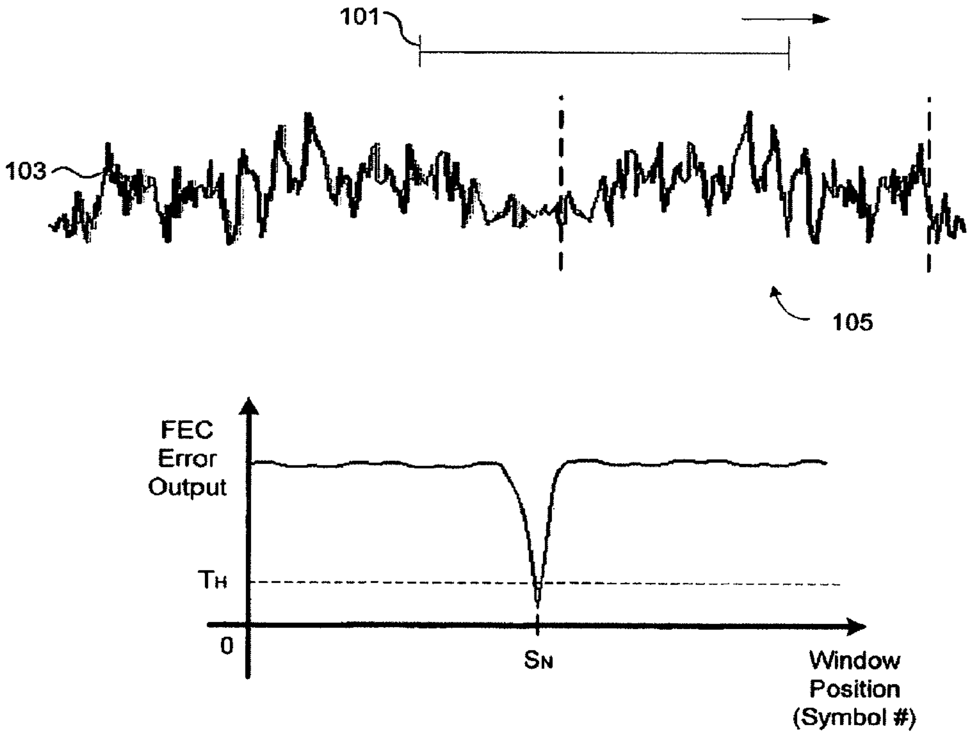
Figure 11A:
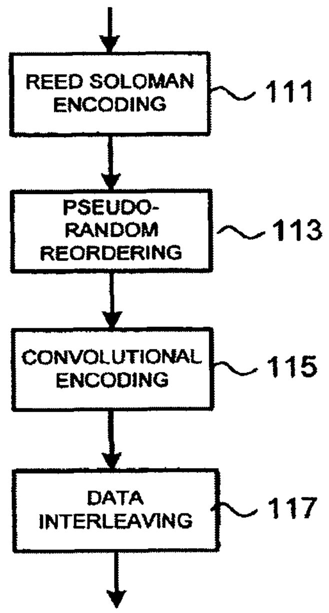
Figure 11B:
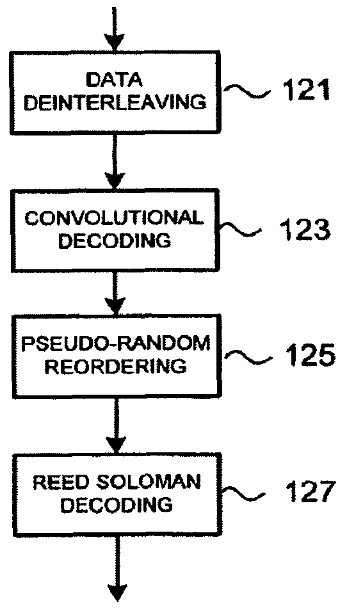

FIG. 6*a* illustrates a shaping and modulation function that is applied to the echoes prior to being combined with the audio signal when a binary "one" is to be transmitted;

FIG. 6*b* illustrates a shaping and modulation function that is applied to the echoes prior to being combined with the audio signal when a binary "zero" is to be transmitted;

FIG. 6*c* illustrates the way in which the shaping and modulation function varies when two successive binary "ones" are to be transmitted;

FIG. 6*d* illustrates the shaping and modulation function that is applied when a binary "zero" is transmitted after a binary "one";

FIG. 7 illustrates the processing performed in the receiver shown in FIG. 1 for recovering the hidden data from the received audio signal;

FIG. 8*a* is an autocorrelation plot for a typical audio signal without artificial echoes;

FIG. 8*b* is an autocorrelation plot for the audio signal with artificial echoes during a first half of a bit symbol;

FIG. 8*c* is an autocorrelation plot for the audio signal with artificial echoes during the second half of the bit symbol;

FIG. 8*d* is a plot obtained by subtracting the autocorrelation plot shown in FIG. 8*c* from the autocorrelation plot shown in FIG. 8*b*;

FIG. 9 is a block diagram illustrating an alternative form of receiver used to receive and recover the hidden data embedded in the audio signal;

FIG. 10 is a plot illustrating the way in which an FEC error count varies during a synchronisation process used to find the hidden data message within the input signal; and FIGS. 11*a* and 11*b* illustrate the processing performed respectively by an FEC encoder and an FEC decoder in one embodiment.

OVERVIEW

FIG. 1 is a block diagram illustrating a transmitter and receiver system according to one embodiment in which a transmitter 1 transmits data hidden within an acoustic signal 3 to a remote receiver 5. The transmitter 1. may form part of a television or radio distribution network and the receiver may be a portable device such as a cellular telephone handset that is capable of detecting the acoustic signal 3 output by the transmitter 1.

The Transmitter

As shown in FIG. 1, the transmitter 1 includes a forward error and correction (FEC) encoder module 7, which receives and encodes the input data to be transmitted to the remote receiver 5. The encoded message data output from the FEC encoding module 7 is then passed to an echo generation and shaping module 9, which also receives an audio signal in which the encoded message data is to be hidden. The echo generation and shaping module 9 then hides the message data into the audio by generating echoes of the audio which depend upon the message data to be transmitted. The generated echoes are then combined with the original audio signal in a combiner module 11 and the resulting modified audio signal is then passed to a gain control module 13 for appropriate gain control. The audio signal is then converted from a digital signal to an analogue signal by the digital to analogue converter 15 and it is then amplified by a driver module 17 for driving a loudspeaker 19 which generates the acoustic signal 3 having the data hidden therein.

Figure 2A:
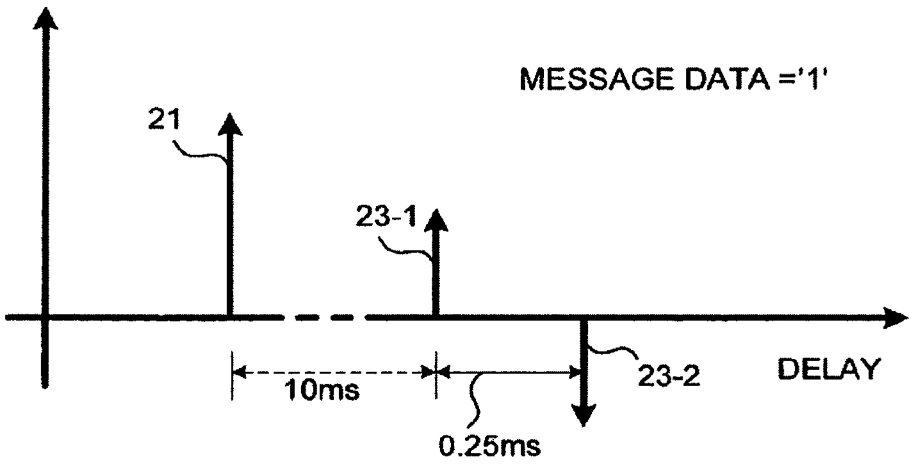
Figure 2B:
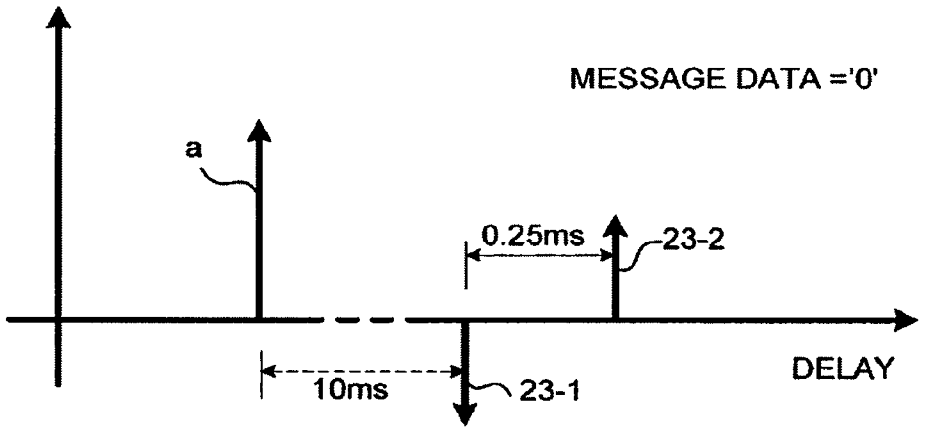

As will be described in more detail below, in this embodiment, the polarity of the echoes (as opposed to their lag and/or amplitude) is varied in order to encode the data to be transmitted. The inventors have found that this polarity modulation can be more robust in the presence of natural echoes and periodicities in the audio signal. This is particularly the case when each data value is represented by two echoes of the same magnitude but having different lags and opposite polarities. The polarities of the echoes representing each message bit are reversed to distinguish between a binary zero and a binary one. This is illustrated by the impulse plots illustrated in FIG. 2. In particular, FIG. 2*a* is an impulse plot illustrating the component signals that are present when a binary one is to be transmitted and FIG. 2*b* is an impulse plot illustrating the component signals present when a binary zero is to be transmitted. As shown in FIG. 2*a*, the component signals include an initial impulse 21 representing the original audio signal followed by two lower amplitude impulses 23-1 and 23-2 representing the two echoes of the original signal component 21 which are added to the audio signal. As can be seen by comparing FIGS. 2*a* and 2*b*, when a binary one is to be transmitted, a positive echo 23-1 is transmitted first followed by a negative echo 23-2; and when transmitting a binary zero a negative echo 23-1 is transmitted first followed by a positive echo 23-2. Although this could be reversed if desired.

As shown in FIG. 2, in this embodiment, the first echo is added with a lag of approximately ten milliseconds and the second echo is added 0.25 milliseconds after the first echo. This is the same regardless of whether a binary one or a binary zero is to be transmitted. Additionally, as represented in FIG. 2, in this embodiment, the echoes that are added have lower amplitudes compared with the amplitude of the original audio signal. In particular, in this embodiment, the amplitude of the echoes is approximately one third that of the original audio signal.

The Receiver

FIG. 1 also illustrates the main components of the receiver 5. As shown, the receiver includes a microphone 31 for detecting the acoustic signal 3 and for converting it into a corresponding electrical signal which is then filtered and amplified by filter and amplification circuitry 33. The output from the filter amplification circuitry 33 is then digitised by an analogue to digital converter 35 and the digital samples are then passed to an echo detector 37. The echo detector 37 then processes the digital samples to identify the polarities of the echoes in the received signal. This information is then passed through a data recovery module 39 which processes the echo information to recover the encoded message data. This message data is then decoded by a decoder 41 to recover the original data that was input to the FEC decoding module of the transmitter 1.

Manchester Encoding

As will be explained in more detail below, the echo detector 37 detects the echoes from the received signal by calculating the auto-correlation of the received signal at specified delays. However, natural echoes (e.g. room echoes) will also contribute to the autocorrelation values thus calculated as will periodicities of the original audio track. In order to distinguish the artificial echoes representing the encoded data from these natural echoes, the message data is also Manchester encoded so that a message data value of “1” is transmitted as a “1”, followed by a “0” (or vice versa), whilst a message data value of “0” is transmitted as a “0” followed by a “1”. In this embodiment, this Manchester encoding is performed by the echo generation and shaping module 9. Therefore, when a message bit value of “0” is to be transmitted, for the first half of the symbol, the first echo 23-1 is of positive polarity and the second echo 23-2 is of negative polarity, whilst for the second half of the symbol, the first echo 23-1 is of negative polarity and the second echo 23-2 is of positive polarity. To transmit a message bit value of “0”, all polarities are reversed, as summarised in the table given below.

| | first half of symbol | | second half of symbol | |
|---|---|---|---|---|
| data value | polarity of first echo | polarity of second echo | polarity of first echo | polarity of second echo |
| 0 | Positive | negative | negative | positive |
| 1 | Negative | positive | positive | negative |

The reason that the Manchester encoding can help to distinguish the artificial echoes from the natural echoes is that the natural echoes will be stable over the two half symbol periods. Therefore, by subtracting the autocorrelations in the second half of the symbol from autocorrelations in the first half of the symbol (or vice versa), the effect of the natural echoes and periodicities will cancel, whilst the autocorrelation peaks caused by the artificial echoes will add constructively. Similarly, the reason for using two echoes in each half symbol period is to distinguish the artificial echoes from periodicities in the original track. Typically, the autocorrelation of the original track will not change significantly between these two lags (i.e. between 10 ms and 10.25 ms).

Therefore, by differencing the autocorrelations at the two lags, the effect of the periodicities is reduced and the autocorrelation peaks caused by the two echoes add constructively.

Figure 3A:
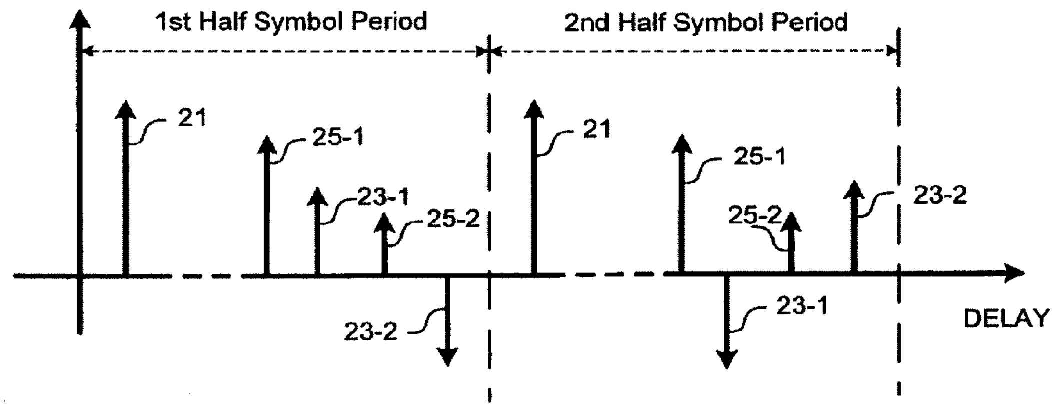
Figure 3B:
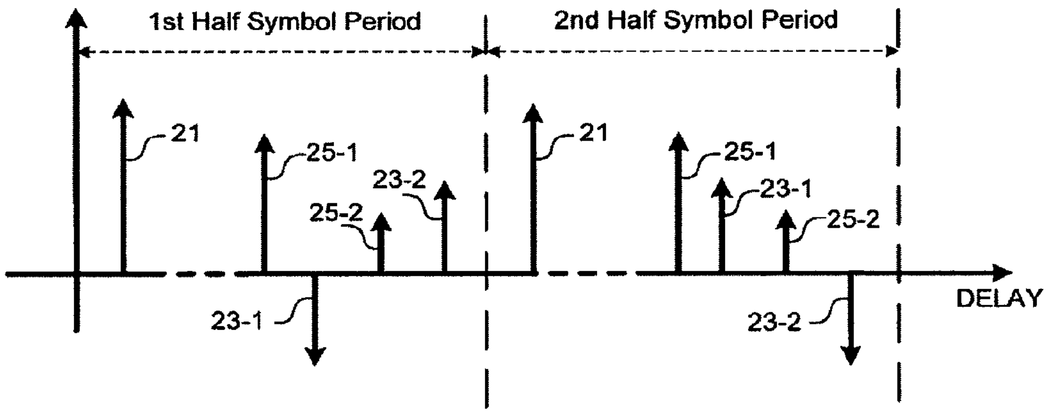

FIGS. 3*a* and 3*b* are impulse plots showing the two half symbols and the artificial echoes 23 that are added within each half symbol period to represent a binary "1" and a binary "0" respectively. FIGS. 3*a* and 3*b* also illustrate natural echoes 25-1 and 25-2 which do not change from one half period to the next. Therefore, by subtracting the echoes in one half of the symbol period from the corresponding echoes (i.e. those with the same lag or delay) in the other half of the symbol period, the effect of the natural echoes and periodicities will cancel, whilst the artificial echoes will add constructively, thereby making it easier to detect the hidden data.

The above description provides an overview of the encoding and decoding techniques used in the present embodiment. A more detailed description will now be given of the main components of the transmitter 1 and receiver 5 to carry out the encoding and decoding processes described above.

FEC Encoder

Figure 4:
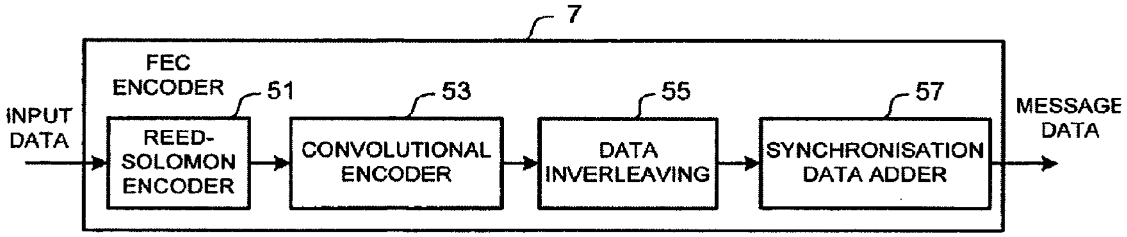
FIG. 4 is a block diagram illustrating in more detail the encoding performed in the transmitter shown in FIG. 1.

FIG. 4 is a block diagram illustrating the main components of the FEC encoder module 7 used in this embodiment. As shown, the first encoding module is a Reed-Solomon encoder module 51 which uses a shortened (13, 6) block code to represent the input data. The data output from the Reed-Solomon encoder 51 is then passed to a convolutional encoder 53 which performs convolutional encoding on the data. The data bits output from the convolutional encoder 53 are then interleaved with each other by a data interleaving module 55 to protect against errors occurring in bursts. Finally, a synchronisation data adder module 57 adds a sequence of synchronisation bits that will help the receiver 5 lock on to the encoded data within the received acoustic signal 3. The output from the synchronisation data adder module 57 represents the message data which is then passed to the echo generation and shaping module 9 shown in FIG. 1.

Echo Generation and Shaping

Figure 5:
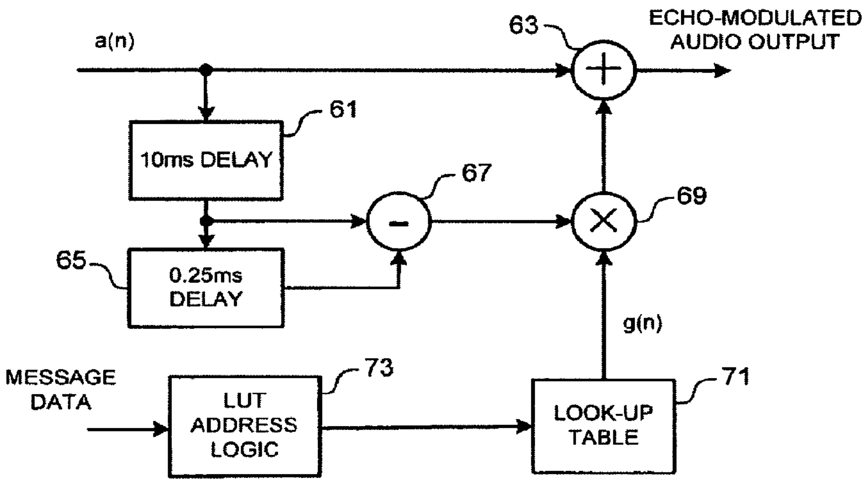
FIG. 5 is a block diagram illustrating the main components of an echo generation and shaping module forming part of the transmitter shown in FIG. 1.

FIG. 5 is a block diagram illustrating the main components of the echo generation and shaping module 9 and the combiner module 11 shown in FIG. 1. The input audio signal is represented by the sequence of audio samples a(n) which are applied to a 10 millisecond delay unit 61 and to the adder 63 (corresponding to the combiner 11 shown in FIG. 1). The 10 millisecond delay unit 61 delays the input sample a(n) by 10 milliseconds which it then outputs to a 0.25 millisecond delay unit 65 and to a subtractor 67. The 0.25 millisecond delay unit 65 delays the audio sample output from the 10 millisecond delay unit 61 by a further 0.25 milliseconds which it then outputs to the subtractor 67. The subtractor 67 subtracts the 10.25 millisecond delayed sample from the 10 millisecond delayed sample outputting the result to a multiplier 69. The delay units and the subtractor operate each time a new audio sample a(n) arrives. In this embodiment, the audio sample frequency is one of 8 kHz, 32 kHz, 44.1 kHz or 48 kHz.

Therefore, as those skilled in the art will appreciate, the 10 millisecond delay unit 61, the 0.25 millisecond delay unit 65 and the subtractor 67 will generate the two echoes 23-1 and 23-2 illustrated in FIG. 2. At this stage, however, the echoes that have been generated do not depend on the data to be transmitted. As will be explained below, this dependency is achieved by multiplying the echoes in the multiplier 69 with a modulation function g(n) that is output by a lookup table 71 which is addressed by lookup table address logic 73 in response to the current message data value. In particular, the lookup table output g(n) changes the polarity of the echoes in dependence upon the message data so that the echoes with the modulated polarities can then be added back to the original audio signal by the adder 63 to generated the echo-modulated audio output signal.

Lookup Table Output g(n)

The inventors have found that abrupt changes in the echoes that are added can make the echoes more obtrusive to users in the vicinity of the loudspeaker 19. Therefore, the lookup table output g(n) is gradually increased and decreased so that the echoes are effectively faded in and out.

Additionally, in this embodiment, the lookup table output g(n) also performs the above described Manchester encoding of the message data. The way in which this is achieved will now be explained with reference to FIG. 6. In particular, FIG. 6*a* is a plot illustrating the way in which the lookup table output g(n) varies over one symbol period, when the bit value of the message data is a binary "1". In this embodiment, the symbol period is 100 ms. As shown, during the first half of the symbol period, the function g(n) increases from zero to a maximum value and then decreases back to zero at the end of the first half of the symbol period. During the second half of the symbol period, the function g(n) is negative and increases in magnitude to a maximum negative value and then decreases back to zero. As can be seen from FIG. 6*a*, in this embodiment, the gradual increasing and decreasing of the lookup table output g(n) is achieved by using a sinusoidal function. Therefore, during the first half of the symbol, the combined echoes output from the subtractor 67 will be multiplied by a positive value and so their polarity will not be changed when they are multiplied by g(n) in the multiplier 69. On the other hand, during the second half of the symbol period the lookup table output g(n) is negative and therefore, the polarities of the echoes output from the subtractor 67 will be reversed when the echoes are multiplied by g(n) in the multiplier 69.

As mentioned above, the artificial echoes 23 that are generated and added to the audio signal have an amplitude which is approximately a third that of the audio signal. In this embodiment, the amplitude of the echoes is controlled by the output of the lookup table g(n). As shown in FIG. 6*a*, the peak amplitude of the lookup table output g(n) is a third, which means that the maximum amplitude of the echoes which are added to the audio signal will be a third of the amplitude of the original audio signal.

As shown in FIG. 6*b*, when the message data is a binary value "0" the lookup table output g(n) is inverted compared with when the message data has a binary value of "1". Therefore, during the first half symbol period, the polarity of the echoes output from the subtractor 67 will be reversed when they are multiplied by g(n) in the multiplier 69 and during the second half of the symbol period the polarities of the echoes output by the subtractor 67 will not be inverted when they are multiplied by g(n) in the multiplier 69.

FIG. 6*c* illustrates the lookup table output g(n) over two symbol periods when the message data to be transmitted is a binary "1" followed by another binary "1". As shown in FIG. 6*c*, in this case, the lookup table output g(n) is a simple repeat of the output illustrated in FIG. 6*a*. Similarly, if successive values of the message data are binary "0's" then the lookup table output g(n) over the two symbol periods will be the inverse of that shown in FIG. 6*c*.

However, If the message data transitions from a binary "1" to a binary "0", then instead of using a lookup table output function obtained by concatenating the functions shown in FIG. 6*a* and FIG. 6*b*, the function shown in FIG. 6*d* is used instead. As can be seen in FIG. 6*d*, when the lookup table output g(n) reaches its peak negative value in the first symbol period, it remains at that value until the peak would have occurred in the second symbol period before decreasing in magnitude back to zero. Similarly, when successive bits of the message data transition from a binary "0" to a binary "1", the lookup table output g(n) over the two symbol periods will be the inverse of that shown in FIG. 6*d*. The inventors have found that not returning to the zero level in this way reduces the obtrusiveness of the echo modulation scheme that is used. This is because the human ear is more sensitive to changing echoes than to constant echoes.

As those skilled in the art will appreciate, the lookup table address logic 73 is responsible for analysing the successive bits of the message data and then to look up the appropriate part of the lookup table 71 so that the appropriate output function g(n) is applied to the multiplier 69.

Echo Detector

FIG. 7 is a part schematic and part block diagram illustrating the processing performed by the echo detector 37. In particular, FIG. 7 illustrates 100 milliseconds of an input signal 61 at the input of the echo detector 37. As those skilled in the art will appreciate, the input signal 61 is illustrated schematically as a continuous signal for ease of understanding but it will be a sampled and digitised waveform.

As illustrated by window i and window j, the echo detector 37 includes two sliding windows 63-1 and 63-2 which extract adjacent segments of the input audio signal 61-1 and 61-2, each of length 50 milliseconds. Therefore, the two windows 63 extract portions of the input acoustic signal 61 which correspond to the above-described half symbol periods. As shown in FIG. 7, the extracted portion 61-1 of the input acoustic signal is input to a first autocorrelation unit 65-1 and the extracted portion 61-2 of the input audio signal is input to a second autocorrelation unit 65-2. Both autocorrelation units 65 operate to determine the autocorrelation of the corresponding portion 61-1 or 61-2 of the input acoustic signal at 10 millisecond and 10.25 millisecond lags. The determined autocorrelation values at lags 10.25 from autocorrelation units 65-1 and 65-2 are then input to a subtractor 67, that subtracts the autocorrelation value obtained from window j from the autocorrelation value obtained from window i (or vice versa). The result of this subtraction is then supplied to another subtractor 69. Similarly, the autocorrelation value at lag 10 milliseconds from window i and the autocorrelation value at lag 10 milliseconds from window j are output from the autocorrelation units 65 to the subtractor 71, that subtracts the autocorrelation value obtained from window j from the autocorrelation value obtained from window i (or vice versa) and feeds the result to the subtractor 69. The subtractor 69 then subtracts the output from subtractor 67 from the output from subtractor 71 (or vice versa). Therefore, the output from the subtrator 69 is represented by the following equation:

$$(A^i(10)-A^j(10))-(A^i(10.25)-A^j(10.25))$$

As mentioned above, subtracting the autocorrelation values of one half symbol period from the corresponding autocorrelation values of the other half symbol period can reduce the effect of natural echoes in the input acoustic signal 61. This is because natural echoes are unlikely to change from one half symbol period to the next and so their effect will be constant in the autocorrelations that are calculated. Consequently, performing this subtraction will remove this common effect. Likewise, subtracting the autocorrelation values obtained from each half symbol period will reduce the effect of periodicities in the original audio signal. This is because in the 0.25 ms delay between the first echo and the second echo in the half symbol period, the effect of the periodicities on the autocorrelations will be approximately constant and so this subtraction will remove this common effect. This will now be described in more detail with reference to FIG. 8.

FIG. 8*a* shows an autocorrelation plot 81 obtained from a typical audio signal without any artificial echoes. As shown, the autocorrelation plot 81 has a peak at zero lag. However, because of periodicities in the audio signal and because of natural echoes, the autocorrelation plot 81 does not tail off towards zero until about 15 milliseconds after the initial peak and exhibits local peaks and troughs in between. Peak 82 illustrates such a local peak that may occur as a result of a natural echo being added to the audio signal.

FIG. 8*b* illustrates an autocorrelation plot 83 for the same audio signal after a positive echo has been added at a lag of 10 milliseconds and a negative echo has been added at a lag of 12 milliseconds (rather than at 10.25 ms so that the two echoes can be seen more clearly). As shown in FIG. 8*b*, as a result of the artificial echoes, the autocorrelation plot 83 includes a peak 85 at 10 milliseconds and a peak 87 at 12 milliseconds. However, the peak 85 is masked somewhat by the earlier peak 82 caused by a natural echo.

FIG. 8*c* illustrates the autocorrelation plot 89 for the audio signal after the echoes have been added in the second half of the symbol period. As shown, the autocorrelation plot 89 includes a negative peak 91 at 10 milliseconds and a positive peak 93 at 12 milliseconds.

Finally, FIG. 8*d* illustrates the autocorrelation plot that is obtained by subtracting the autocorrelation plot shown in FIG. 8*c* from the autocorrelation plot shown in FIG. 8*b*. As can be seen, the common peaks in the autocorrelation plots shown in FIGS. 8*b* and 8*c* have been removed, whilst the complementary peaks 85 and 91; and 87 and 93 have added together to create the combined peaks 95 and 97 respectively. As those skilled in the art will appreciate, it is therefore much easier to detect the peaks 95 and 97 because their values are much greater than the autocorrelation values at other lags. This effect is further enhanced by subtracting the autocorrelation value at 12 milliseconds from the autocorrelation value at 10 milliseconds. This will effectively add the two peaks 95 and 97 together to provide an even larger peak, which can then be detected by suitable thresholding. The value of the corresponding data value can then be determined from the polarity of the combined peak.

As those skilled in the art will appreciate, in this embodiment, the echo detector 37 does not calculate the autocorrelation of the input signal over all lags. It only calculates the autocorrelation values at the lags where the artificial echoes have been added. The plots shown in FIG. 8 show the autocorrelation values over lags from 0 to 15 milliseconds. These plots therefore help to illustrate the effect of natural echoes and periodicities in the audio signal which can mask the artificial echoes that are added to encode the data.

Synchronisation

In this embodiment, the receiver 5 knows the duration of each half symbol period. This defines the length of the windows 63-1 and 63-2 used in the echo detector 37. However, the echo detector 37 initially will not be synchronised with the transmitted data. In other words, the echo detector 37 does not know where each symbol period begins and ends or where the start of the message is located. Therefore, in this embodiment, the echo detector 37 performs the above analysis as each new sample is received from the analogue to the digital converter 35. The output from the subtractor 69 is then analysed by the data recovery module 39 to determine the most likely symbol boundaries. The data recovery module then determines the location of the start of the message by finding the synchronisation bits that were added by the synchronisation data adder 57. At this point, the data recovery unit 39 can start to recover the whole message from the polarity of the autocorrelation values output from the subtractor 69.

Once synchronisation has been achieved, the echo detector 37 will typically determine the autocorrelation measurements in the middle of each half symbol period, when the echo is expected to be at its peak amplitude and the data recovery module 39 will determine the bit value from the polarity of the output from the subtractor 69. The echo detector 37 may also take measurements just before and just after the middle of each half symbol period, to allow the data recovery module 39 to track the synchronisation.

The message data recovered by the data recovery module 39 is then input to the FEC decoding module 41 where the message data is decoded (using the inverse processing of the FEC encoder 7) to obtain the original input data that was input to the encoder 7 of the transmitter 1.

Modifications and Alternatives

In the above embodiments, the data was hidden within an audio signal by employing a number of echoes whose polarity varied with the data value to be transmitted. These echoes were added to the original audio signal after appropriate delays. As those skilled in the art will appreciate, the echoes may be added before the original audio signal (preechoes), before and after the original audio signal or only after the original audio signal.

In the above embodiment, synchronisation bits were added to the data that was transmitted so that the decoder can identify the boundaries of each symbol period and the start and end of each message. The use of such synchronisation bits significantly increases the overall message length that has to be transmitted (in some cases by as much as 25%). Additionally, as the decoding of each bit is subject to noise, the matching is not perfect which can reduce the chances of a successful synchronisation. The inventors have realised, however, that the synchronisation bits are not required. In particular, the inventors have realised that the FEC decoding module 41 will have higher error rates when the echo detector 37 is not properly synchronised with the incoming data compared with its error rate when the echo detector is synchronised with the incoming data. Therefore, in the embodiment illustrated in FIG. 9, the error output generated by the FEC decoding module 41 is used to control the synchronisation of the receiver to the incoming data.

More specifically, in this embodiment, the echo detector 37 receives a block of samples corresponding to one or more symbol(s) and determines the optimum time within that block of samples to detect the echoes within the symbols. Multiple symbols may be required when Manchester encoding is used as a Manchester encoded "one" looks the same as a Manchester encoded "zero" with a time shift. Therefore, it may be necessary to consider a number of symbols to allow the symbol boundaries to be identified. The actual determination of the optimum time within the block of samples to detect the echoes may be determined by passing the block of samples through a matched filter (loaded with the expected signal pattern for one symbol period) and the time within the symbol when the absolute output (averaged over a number of successive symbols) is at a maximum is deemed to be the best time to sample the symbols. For example, if there are N samples per symbol, and the block of samples has M symbols, then the following values are calculated:

$$\text{average}(0) = 1/M * (x(0) + x(N) + x(2N) + \dots\ )$$

$$\text{average}(1) = 1/M * (x(1) + x(N+1) + x(2N+1) + \dots\ )$$

-continued $$\dots$$

$$\text{average}(N-1) = 1/M * (x(N-1) + x(2N-1) + x(3N-1) + \dots\ )$$

where x(i) is absolute output of the matched filter for sample i. The largest average value thus determined identifies the best time to detect the echoes within the incoming signal during each symbol.

The echo detector 37 then uses the determined optimum time to detect echoes in that symbol and in the previous N−1 symbols of the input signal (where N is the number of symbols in the transmitted message). The data recovery module 39 then determines, from the detected echoes, bit value(s) for each symbol and outputs the string of bits corresponding to the possible message to the FEC decoding module 41. The FEC decoding module 41 then performs the inverse processing of the FEC encoder 7 to regenerate a candidate input data codeword, which is stored in the buffer 93. The FEC decoding module 41 also outputs an error count indicating how many errors are identified in the candidate codeword, which it passes to a controller 91. In response, the controller 91 compares the error count with a threshold value and if it is greater than the threshold, then the controller 91 flushes the candidate codeword from the buffer 93. The above process is then repeated for the next received symbol in the input signal, until the controller 91 determines that the error count is below the threshold. When it is, the controller 91 instructs the FEC decoding module 41 to accept the candidate codeword, which it then outputs for further use in the receiver 5. In effect, therefore, the echo detector 37, the data recovery module 39 and the FEC decoding module 41 all operate on a window of the input signal corresponding to the length of the transmitted message, which window is slid over the input signal until a point is found where the FEC error count is below a defined threshold—indicating the identification of the full message within the input signal.

FIG. 10 is a plot illustrating the way in which the FEC decoding module's error count 99 is expected to change as the window 101 is slid over an input signal 103 containing a data message 105, with the minimum appearing at symbol SN, when the window 101 is aligned with the data message 105 in the input signal 103. The threshold (Th) level is then set to reduce the possibility that false minimums in the FEC error output count are considered as possible codewords, so that (in the ideal situation) only when the receiver 5 is properly synchronised (aligned) to the message data, will the FEC decoding module's error count reduce below the threshold in the manner illustrated in FIG. 10. Ideally, in this embodiment, the FEC encoding/decoding that is used is designed to keep the error rate of the FEC decoding module 41 high except when the window 101 is aligned with the message data 105 in the input signal 103. The inventors have found that this simple thresholding technique is sufficient to identify the location of the message data in the input signal 103. However, if more accurate detection is required, then further consideration can be made, varying the possible positions of the start and end of the message and looking for the positions that give the minimum FEC error count.

The above technique is useful for finding a single message in the input signal. Clearly, if a sequence of such data messages is transmitted, then the synchronisation timing determined for the first data message may be used to identify the synchronisation timing for the next data message.

One problem identified by the inventors with the synchronisation approach discussed above is that the FEC encoder 7 often uses cyclic codewords (for example when using Reed Solomon block encoding) which means that a one bit shift in the codeword can also be a valid codeword. This is problematic because it can result in false detections of a codeword (a so called false positive) in the input signal 105. This problem can be overcome by reordering the bits of the codeword in the FEC encoder 7 in some deterministic manner (for example in a pseudo random manner), and using the inverse reordering in the FEC decoder 41. The processing that may be performed by the FEC encoder 7 and by the FEC decoder 41 in such an embodiment is illustrated in FIGS. 11 *a* and 11 *b* respectively. As shown, the FEC encoder 7 performs a cyclic encoding of the data (in this case Reed Solomon encoding 111), followed by a pseudo random reordering 113 of the data. The reordered data is then convolutionally encoded 115 and then interleaved 117 as before. Similarly, the FEC decoding module 41 initially deinterleaves 121 the data and performs convolutional decoding 123. The FEC decoding module 41 then reverses 123 the pseudo random data reordering performed by the FEC encoder 7 and then performs the Reed Solomon decoding 125. As those skilled in the art will appreciate, by performing this reordering of the data in this way, if there is a bit shift in the message data output by the data recovery module 39, then it is far less likely to result in a valid codeword and so the FEC error rate output is unlikely to trigger the false identification of a data message.

In the above embodiments, each data value was represented by four echoes—two echoes in each of two half symbol periods. As those skilled in the art will appreciate, each data value may be represented by any number of echoes in any number of subsymbol periods. For example, instead of having two echoes within each half symbol period, each data value may be represented by a single echo in each half symbol period. In this case, the echoes in each half symbol period would preferably be of opposite polarity so that the same differencing technique can be used to reduce the effects of natural echoes. Indeed, the inventors have found that in some cases using two echoes of opposite polarity in each half symbol period can result in some frequency components within the original audio signal adding constructively with the echoes and some frequency components within the original audio signal adding destructively with the echoes. If a single artificial echo is added, then such distortions are less evident making the hidden data less noticeable to users in the acoustic sound that is heard.

As those skilled in the art will appreciate, representing each data value by one or more echoes in different sub-symbol periods, means that the echoes in each sub-symbol period will be a repetition of a different portion of the audio signal. If there is only one symbol period, then each data value will be represented by echoes of the same (or substantially the same) portion of the audio signal.

In the above ‘embodiments, each data value was represented by a positive and a negative echo in a first half symbol period and by a positive and a negative echo in the second half symbol period. The positive and negative echoes in the first half symbol period allowed the receiver to reduce the effects of periodicities in the original audio signal which effect the autocorrelation measurements. The use of complementary echoes in adjacent half symbol periods allows the receiver to reduce the effect of natural echoes within the received audio signal, which might otherwise mask the artificial echoes added to represent the data. As those skilled in the art will appreciate, in other embodiments, neither or only one of these techniques may be used.

In the above embodiment, each data value was represented by echoes within two adjacent half symbol periods. As those skilled in the art will appreciate, these two half symbol periods do not have to be immediately adjacent to each other and a gap may be provided between the two periods if required.

In the above embodiment, the echoes in each half symbol period were of exactly the same portion of the audio signal. As those skilled in the art will appreciate, this is not essential. The echoes in each half symbol period may be of slightly different portions of the audio signal. For example, one echo may miss out some of the audio samples of the audio signal. Alternatively, the audio signal may include different channels (for example left and right channels for a stereo signal) and one echo may be formed from a repetition of the left channel and the other may be formed from a repetition of the right channel. With modern multi channel surround sound audio the repetitions can be of any of these channels.

In the above embodiment, the echoes generated within the transmitter were added to the original audio signal. As those skilled in the art will appreciate, the generated echoes may be combined with the original audio signal in other ways. For example, the echoes may be subtracted from the audio signal. Similarly, instead of inverting the echoes to be added to the audio (by controlling the polarity of the function g(n)), the same result can be achieved by changing the way in which the echoes are combined with the audio signal. For example, one echo may be added to the original audio signal whilst the next echo may be subtracted from the audio signal.

In the above embodiment, the lookup table stored values for g(n) corresponding to one or two bits of the message data (as illustrated in FIG. 6). As those skilled in the art will appreciate, this is not essential. For example, the lookup table could simply store a function which increased in value and then decreased in value. Additional circuitry could then be provided to convert the polarity of this output as appropriate for the two half symbol periods. In this way, the function stored in the lookup table would only control the fading in and out of the echo and the additional circuitry would control the polarity of the echo as required.

In the above embodiment, the Manchester encoding was performed by the echo generation and shaping module. As those skilled in the art will appreciate, this Manchester encoding, if performed, may be performed within the FEC encoding module.

As those skilled in the art will appreciate, the techniques described above for hiding data within the audio may be done in advance of the transmission of the acoustic signal or it may be done in real time. Even in the case where the data is to be embedded within an audio signal in real time, some of the processing can be done in advance. For example, the FEC encoding may be performed on the data in advance so that only the echo generation and echo shaping is performed in real time.

In the above embodiments, specific examples have been given of sample rates for the audio signal and symbol rates for the data that is hidden within the audio signal. As those skilled in the art will appreciate, these rates are not intended to be limiting and they may be varied as required. However, in order to keep the obtrusiveness of the added echoes to a minimum, the data rate of the encoded data is preferably kept between one and twenty symbols per second. This corresponds to a symbol period of between 50 ms and 1 second. In some embodiments, a long symbol period is beneficial because the added echoes will span across spoken words within the audio, making it easier to hide the data echoes within the audio. A larger symbol period also reduces audibility of the echoes. This is because humans are more sensitive to changing echoes than they are to static or fixed echoes. Therefore, by having a longer symbol period, the rate of change of the echoes is lower making the presence of the echoes less noticeable to a user.

In the above embodiment, the data rate of the data added to the audio signal in the transmitter was constant and was known by the receiver. This knowledge reduces the complexity of the receiver circuitry for locking on to the data within the received signal. However, it is not essential to the invention and more complex circuitry may be provided in the receiver to allow the receiver to try different data rates until the actual data rate is determined. Similarly, the receiver may use other techniques to synchronise itself with the transmitted data so that it knows where the symbol boundaries are in advance of receiving the data.

In the above embodiment, FEC encoding techniques were used to allow the receiver to be able to correct errors in the received data. As those skilled in the art will appreciate, such encoding techniques are not essential to the invention. However, they are preferred, as they help to correct errors that occur in the transmission process over the acoustic link.

In the above embodiments, the peak amplitudes of the echoes were all the same and were independent of the data value being transmitted. As those skilled in the art will appreciate, the peak amplitudes of the echoes may also be varied with data to be transmitted if desired.

In the above embodiment, the echoes in each half symbol period were at the same delays relative to the original audio signal. As those skilled in the art will appreciate, this is not essential. There may be some variation in the actual delay values used within each half symbol period.

In the above embodiment, the second echo within each half symbol period was generated by delaying the first echo by a further delay value. In an alternative embodiment, each echo within each sub-symbol period may be independently generated from the original audio signal using an appropriate delay line.

As those skilled in the art will appreciate, various uses can be made of the above communication system. For example, the encoded data may be used as a watermark to protect the original audio signal. Alternatively, the embedded data may be used to control the receiver so that it can respond in synchronism with the audio signal. In particular, the decoder can be programmed to perform some action a defined time after receiving the codeword. The time delay may be programmed into the decoder by any means and may even be defined by data in the received codewords. When used to perform such synchronisation, shorter symbol periods are preferred as shorter symbol periods allows for better temporal resolution and hence more accurate synchronisation. The data may be used for interactive gaming applications, audience surveying, ecommerce systems, toys and the like. The reader is referred to the Applicant's earlier International application WO02/45273 which describes a number of uses for this type of data hiding system.

In the above embodiment, the receiver performed autocorrelation measurements on the input audio signal in order to identify the locations of the echoes. As those skilled in the art will appreciate, other techniques can be used to identify the echoes. Some of these other techniques are described in the Applicant's earlier PCT application PCT/GB2008/001820 and in U.S. Pat. No. 5,893,067, the contents of which are incorporated herein by reference. Typically, although not necessarily, the techniques involve some form of autocorrelation of the original audio signal or of parameters obtained from the audio signal (eg LPC parameters, cepstrum parameters etc). As an alternative, a best fit approach could be used in which an expected audio signal (with different echo polarities) is fitted to the actual signal until a match is found and the polarity of the echoes thus determined.

In the embodiment described above, a single transmitter was provided together with a receiver. As those skilled in the art will appreciate, multiple transmitters and/or multiple receivers may be provided. Further, the components of the transmitter may be distributed among a number of different entities. For example, the encoding and data hiding part of the transmitter may be provided within a head end of a television distribution system or a user's set top box and the loudspeaker 19 may be a speaker of the user's television set.

In the above embodiments, the echoes were directly derived from the original audio signal. In alternative embodiments, the echo may not include all frequency components of the audio signal. For example, one or more of the echoes may be generated from a portion of the audio signal after it has been filtered to remove certain frequencies. This may be beneficial where it is found, for example, that there is additional noise in the low frequency part of the echoes but not in the higher frequency part. In this case, the received signals would also be filtered to remove the lower frequency components (for example frequencies below about 500 Hz) so that only the higher frequency components (those above the lower frequency components) of the audio signal and the echoes would be present in the signals being analysed. Alternatively, in this case, the received signal may be passed through a filter that simply reduces the level of the lower frequency components in the received signal compared with the higher frequency components. This will have the effect of reducing the relevance of the noisy low frequency part of the received signal in the subsequent decoding process. Similarly, if it turns out that the added echoes introduce a noticeable distortion in the higher frequencies of the composite audio signal, then the echoes (or the signals from which they are derived) may be low pass filtered to remove the higher frequencies.

The division of the audio signal into separate frequency bands can also be used to carry data on multiple channels. For example, if the frequency band is divided into a high frequency part and a low frequency part, then one channel may be provided by adding echoes to the high frequency part and another channel may be provided by adding different echoes to the low frequency part. The use of multiple channels in this way allows frequency or temporal diversity if the data carried in the two channels is the same; or allows for an increased data transfer rate if each channel carries different data. Multiple channels can also be provided where the audio signal also contains multiple channels (used to drive multiple speakers). In this case, one or more data channels may be provided in the audio signal for each audio channel.

In the above embodiment, data was hidden within an audio signal by adding echoes to the audio signal. In some situations, the incoming audio may already contain hidden data in the form of such echoes. In this case, the encoder could decode the existing hidden data from the received audio signal and then use the decoded data to clean the audio signal to remove the artificial echoes defining this hidden data. The encoder could then add new echoes to the thus cleaned audio signal to hide the new data in the audio signal. In this way, the original hidden data will not interfere with the new hidden data.

In the above embodiment, the echoes were obtained by delaying digital samples of the audio signal. As those skilled in the art will appreciate, the echoes may be generated in the analogue domain, using suitable analogue delay lines and analogue circuits to perform the echo shaping and polarity modulation.

In the above embodiments, the audio signal with the embedded data was transmitted to a receiver over an acoustic link. In an alternative embodiment, the audio signal may be transmitted to the receiver over an electrical wire or wireless link. In such an embodiment, the data rates that are used may be higher, due to lower noise levels.

In the above embodiment, one data bit was transmitted within each symbol period. In an alternative embodiment, multiple bits may be transmitted within each symbol period. For example a second pair of echoes may be added at lags of 20 ms and 20.25 ms within each half symbol period to encode a second bit; a third pair of echoes may be added at lags of 30 ms and 30.25 ms within each half symbol period to encode a third bit etc. Each echo could then be faded in and out during each half symbol period and polarity modulated in accordance with the bit value as before. The fading in and out of the echoes for the different bits may be the same or it may be different for the different bits. The polarity modulation of the different echoes will of course depend on the different bit values to be transmitted in the symbol period. In a preferred embodiment, the echoes for the different bits within the same half symbol period are faded in and out at different times of the half symbol period, so that the different echoes reach their peak amplitudes at different times within the half symbol period. In this way, when the echo for one bit is at its peak amplitude (or when all the echoes for one bit are at their peak amplitudes—if there are multiple echoes representing each bit in each half symbol period), the echoes for the other bits will not be at their peaks. Doing this and sampling the different echoes when they are expected to be at their peak amplitudes, will reduce the interference between the echoes for the different bits within the same half symbol period. It also reduces constructive interference of the echoes that may render the added echoes more noticeable to a listener. Looking at this another way, this is the same as having multiple parallel data messages, each encoded as per the embodiments described above, but with their respective symbol periods offset in time from each other so that the echoes for the different messages peak at different times—thereby reducing interference between the messages if the echoes are all sampled around the time when they are each at their maximum amplitudes. This technique will increase the bit rate of data transmission between the transmitter and receiver. The additional bits may be of the same message or they may be bits of different messages.

The inventors have found that the above described data hiding techniques do not work as well during portions of the audio that include single tones or multiple harmonic tones, such as would be found in some sections of music. This is because the hidden data becomes more obtrusive to the listener in these circumstances and if the tones are being used as part of an automatic setup procedure they can cause the procedure to fail. Therefore, in one embodiment, the inventors propose to include (within the encoder) a detector that detects the level of tonality or other characteristic of the audio signal and, if it is highly tonal, that switches off the echo addition circuitry. Alternatively, as this switching off of the echoes may itself be noticeable to the user, the encoder may fade the echoes out during periods of high tonality and then fade them back in during periods of low tonality. In this way, the data is only added to the audio signal when the audio signal is not highly tonal in nature. Various techniques may be used for making this detection. One technique for determining the level of tonality of an audio signal (although for a different purpose) is described in the applicant's earlier PCT application W002/45286, the contents of which are incorporated herein by reference. Another technique can be found in Davis P (1995) "A Tutorial on MPEG/Audio Compression", IEEE Multimedia Magazine, 2(2), pp. 60-74. Instead of switching off the echo addition circuitry, the system may be arranged to adapt the amplitude of the added echoes depending on the detected characteristic of the audio signal. Alternatively, instead of varying the amplitudes of the echoes in this way, the encoder may instead or in addition vary the data rate or the symbol period in order to reduce the obtrusiveness of the hidden data during periods when the audio signal is highly tonal.

An embodiment was described above in which a single message was encoded and transmitted to a remote receiver as a number of echoes within an audio signal. In some applications, a sequence of messages may be transmitted. These messages may be the same or they may be different. In either case, each message may be transmitted after a preceding message has been transmitted. Alternatively, the end of one message may be overlapped with the start of the next message in a predefined way (so that the receiver can regenerate each message. This arrangement can increase the time diversity of the transmitted messages making them less susceptible to certain types of noise or data loss. In a further alternative, the data from the different messages may be interleaved in a known manner and transmitted as a single data stream to the receiver. The receiver would then regenerate each message by de-interleaving the bits in the data stream using knowledge of how the messages were originally interleaved.

As discussed above, Convolutional Coding is used as part of the forward error correction (FEC) encoder. As is well known to those skilled in the art, data encoded in this way generally is decoded using a Viterbi decoder, which operates by constructing a trellis of state probabilities and branch metrics. The transmitted data is often terminated with a number of zeros to force the encoder back to the zero state. This allows the decoder to start decoding from a known state, however, it requires extra symbols to be transmitted over the channel. An alternative technique is to ensure that the trellis start and end states are identical. This technique is referred to as tail biting and has the advantage of not requiring any extra symbols to be transmitted. Tail biting is used in many communications standards and, if desired, may be used in the embodiments described above.

The description above has described the operation of a system for hiding data as echoes within an audio signal. The systems described used time domain techniques to generate and add the echoes and to detect the echoes in the received signal. As those skilled in the art will appreciate, equivalent processing can be performed in the frequency domain to achieve the same or similar results.

The inventors have found that in some instances, the decoder does not work as well when the message consists of predominantly 'zero' bits (or conversely predominately 'one' bits), since under the encoding scheme an 'all zeros' codeword segment looks the same as a time-shifted 'all ones' codeword segment. A particular example is the 'all zeros' message, which results in an 'all zeros' codeword after Reed Solomon encoding. The encoding works best when there are approximately equal numbers of ones and zeros in the codeword, evenly distributed throughout the codeword. This can be achieved for the disclosed system by inverting the Reed Solomon parity bits. This has the effect of changing the all zeroes codeword to a mixture of zeroes and ones. This can also be achieved by altering the initial state of the feedback shift register used within the Reed Solomon encoder which is used to generate the parity bits. This gives more flexibility in setting the ratio of ones to zeroes in the codeword. Subsequent interleaving distributes these inverted parity bits throughout the codeword. As those skilled in the art of error detection and correction will appreciate, these approaches to balancing the distribution of ones and zeroes applies to any of the many FEC schemes implemented using feedback shift registers (or Galois field arithmetic) of which Reed Solomon is an example.

In the above embodiments, a number of processing modules and circuits have been described. As those skilled in the art will appreciate, these processing modules and circuits may be provided as hardware circuits or as software modules running within memory of a general purpose processor. In this case, the software may be provided on a storage medium such as a CD-ROM or it may be downloaded into an appropriate programmable device on a carrier signal over a computer network, such as the Internet. The software may be provided in compiled form, partially compiled form or in uncompiled form.

The invention claimed is:

1. A method of recovering a data message embedded in an audio signal, the data message being FEC encoded and embedded in the audio signal as a plurality of echoes, the method comprising:

receiving an input signal having the audio signal and the echoes; and processing the input signal to detect the echoes and to recover the embedded data message;

wherein the processing includes synchronizing the processing of the input signal with the embedded data message; wherein the processing performs an FEC decoding on recovered data; and wherein the synchronizing uses an error signal from the FEC decoding to control the synchronization of the processing to the embedded data message.

2. A method according to claim 1, wherein the receiving receives an input signal corresponding to a sequence of symbols ending with a current symbol, wherein the processing processes the input signal corresponding to the current symbol and the N-1 preceding symbols, where N is a number of symbols in the data message, to detect echoes and to recover a possible message, wherein the possible message is processed by said FEC decoding to generate a candidate data message, wherein the FEC decoding generates error data relating to the generation of the candidate data message and wherein the candidate data message is discarded in dependence upon the error data.

3. A method according to claim 2, wherein the processing is repeated after receipt of input signal corresponding to a next symbol until the error data meets a predetermined condition that indicates synchronisation of the processing to the embedded data message.

4. A method according to claim 3, wherein the predetermined condition is that the error data indicates that a number of errors is less than a threshold.

5. A method according to claim 3, wherein the predetermined condition is that the error data is at a minimum value.

6. A method according to claim 2, wherein the candidate data message is discarded if the error data is greater than a threshold.

7. A method according to claim 1, wherein the input signal comprises a sequence of data messages and wherein a synchronisation timing obtained for one data message is used to identify a synchronisation timing for a subsequent data message in the sequence.

8. A method according to claim 1, wherein said processing is performed in respect of a window of the input signal corresponding to the length of the data message, which window is slid over the input signal until a point is found where FEC error data indicates synchronization of the processing to the embedded data message.

9. A method according to claim 1, wherein the FEC decoding includes a cyclic decoding and further comprises a re-ordering of the recovered data before the cyclic decoding to avoid false detection of a codeword.

10. A method according to claim 9, wherein the FEC decoding includes a convolutional decoding prior to the cyclic decoding and wherein said re-ordering of the recovered data is performed between the convolutional decoding and the cyclic decoding.

11. A method according to claim 9, wherein the re-ordering performs a pseudo random re-ordering of the recovered data prior to cyclic decoding.

12. A method according to claim 9, wherein said cyclic decoding comprises a Reed Solomon decoding.

13. A method according to claim 1, wherein each data symbol is represented by one or more echoes.

14. An apparatus for recovering a data message embedded in an audio signal, the data message being FEC encoded and embedded in the audio signal as a plurality of echoes, the apparatus comprising:

an echo detector that receives an input signal having the audio signal and the echoes and that processes the input signal to identify echoes within the input signal;

a data recovery module that processes the identified echoes to recover data corresponding to the identified echoes;

an FEC decoder for performing FEC decoding of the recovered data to regenerate the data message; and a controller, responsive to an error signal from the FEC decoder, to control the operation of the FEC decoder to synchronize the processing of the input signal with the embedded data message.

15. An apparatus according to claim 14, wherein the echo detector is configured to receive an input signal corresponding to a sequence of symbols, wherein the data recovery module is configured to processes echoes detected by the echo detector in a current symbol and N-1 preceding symbols, where N is the number of symbols within the data message, to recover a possible message, wherein the FEC decoder is configured to process the possible message to generate a candidate data message, wherein the FEC decoder is configured to generate error data indicating errors in the candidate data message and wherein the controller is configured to cause the candidate data message to be discarded in dependence upon the generated error data.

16. An apparatus according to claim 15, wherein after receipt of input signal corresponding to a next symbol, the data recovery module is configured to recover a next possible message and the FEC decoder is configured to generate a next candidate data message, until the error data for the candidate data message meets a predetermined condition that indicates synchronisation of the processing to the embedded data message.

17. An apparatus according to claim 16, wherein the predetermined condition is that the error data is less than a threshold.

18. An apparatus according to claim 16, wherein the predetermined condition is that the error data is at a minimum value.

19. An apparatus according to claim 15, wherein the controller is configured to cause the candidate data message to be discarded if the error data is greater than a threshold.

20. An apparatus according to claim 14, wherein the input signal comprises a sequence of data messages and wherein a synchronisation timing obtained for one data message is used to identify a synchronisation timing for a subsequent data message in the sequence.

21. An apparatus according to claim 14, wherein said echo detector, data recovery module and FEC decoder operate on a window of the input signal corresponding to the length of the data message, which window is slid over the input signal until a point is found where the FEC error signal indicates synchronization of the processing to the embedded data message.

22. An apparatus according to claim 14, wherein the FEC decoder includes a cyclic decoder and is configured to re-order the recovered data before the cyclic decoding to avoid false detection of a codeword.

23. An apparatus according to claim 22, wherein the FEC decoder includes a convolutional decoder and a cyclic decoder and is configured to re-order the recovered data between the convolutional decoding performed by the convolutional decoder and a cyclic decoding performed by the cyclic decoder.

24. An apparatus according to claim 22, wherein the re-ordering is a pseudo random re-ordering of the recovered data.

25. An apparatus according to claim 22, wherein said cyclic decoder comprises a Reed Solomon decoder.

26. An apparatus according to claim 14, wherein each data symbol is represented by one or more echoes.

27. An apparatus for recovering a data message embedded in an audio signal, the data message being FEC encoded and embedded in the audio signal as a plurality of echoes, the apparatus comprising:

means for receiving an input signal having the audio signal and the echoes; and means for processing the input signal to detect the echoes and to recover the embedded data message;

wherein the processing means includes means for synchronizing the processing of the input signal with the embedded data message and an FEC decoder for performing an FEC decoding on recovered data; and wherein the means for synchronizing uses an error signal from the FEC decoder to control the synchronization of the processing to the embedded data message.

28. A computer program product, the computer program product comprising at least one non-transitory computer-readable storage medium having computer-readable program code portions stored therein, the computer-readable program code portions being configured for causing a programmable computer device to perform a method of recovering a data message embedded in an audio signal, the data message being FEC encoded and embedded in the audio signal as a plurality of echoes, the computer-readable program code portions comprising:

an executable portion configured to process a received input signal that has the audio signal and the echoes, to detect the echoes, and to recover the embedded data message;

wherein the executable portion is further configured to:

synchronize the processing of the input signal with the embedded data message;

perform an FEC decoding on the recovered data; and use an error signal from the FEC decoding to control the synchronization of the processing to the embedded data message.

* * * * *

UNITED STATES PATENT AND TRADEMARK OFFICE

CERTIFICATE OF CORRECTION

PATENT NO. : 8,560,913 B2
APPLICATION NO. : 13/232190
DATED : October 15, 2013
INVENTOR(S) : Kelly et al.

It is certified that error appears in the above-identified patent and that said Letters Patent is hereby corrected as shown below:

In the Specification

Column 1

Line 11, "July 31, 2008" should read --May 29, 2008--

Signed and Sealed this
Twenty-fourth Day of December, 2013

Margaret A. Focarino
*Commissioner for Patents of the United States Patent and Trademark Office*